US012775107B2

(12) United States Patent
Tiedje et al.

(10) Patent No.: US 12,775,107 B2
(45) Date of Patent: Oct. 27, 2026

(54) RADIATION DETECTORS HAVING SULFIDE-CONTAINING ANODE CONTACTS AND METHODS OF FABRICATION THEREOF

(71) Applicant: REDLEN TECHNOLOGIES, INC., Saanichton (CA)

(72) Inventors: Thomas Tiedje, Victoria (CA); Hao Yuan, Victoria (CA); Michael K. Jackson, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 177 days.

(21) Appl. No.: 18/914,522

(22) Filed: Oct. 14, 2024

(65) Prior Publication Data

US 2025/0035798 A1 Jan. 30, 2025

Related U.S. Application Data

(63) Continuation-in-part of application No. 18/318,987, filed on May 17, 2023.

(Continued)

(51) Int. Cl.

*G01T 1/24* (2006.01)
*H10F 39/00* (2025.01)
*H10F 39/18* (2025.01)

(52) U.S. Cl.

CPC ............ *G01T 1/24* (2013.01); *H10F 39/022* (2025.01); *H10F 39/1892* (2025.01)

(58) Field of Classification Search

CPC ........................................................ G01T 1/24
See application file for complete search history.

(56) References Cited

U.S. PATENT DOCUMENTS 9,202,961 B2 12/2015 Chen et al.
9,847,369 B2 12/2017 El-Hanany et al.
(Continued)

OTHER PUBLICATIONS

USPTO Office Communication, Non-Final Office Action for U.S. Appl. No. 18/318,987, dated Jun. 18, 2025, 16 pages.

(Continued)

*Primary Examiner* — Edwin C Gunberg
(74) *Attorney, Agent, or Firm* — THE MARBURY LAW GROUP PLLC

(57) ABSTRACT

A radiation detector includes a radiation-sensitive semiconductor substrate, a cathode electrode disposed over a first surface of the radiation-sensitive semiconductor material substrate, and at least one anode electrode disposed over a second surface of the radiation-sensitive semiconductor material substrate, where the at least one anode electrode includes a semiconductor material layer including cadmium sulfide located between a metallic material and the semiconductor material substrate. In one embodiment, the radiation-sensitive semiconductor substrate includes cadmium zinc telluride (CZT), and the semiconductor material layer includes $Cd_{1-x}Zn_xTe_yS_{1-y}$, where $0 \le x \le 0.5$ and $0 \le y \le 0.5$. Further embodiments include methods of fabricating a radiation detector that include exposing a surface of a radiation-sensitive semiconductor material substrate to a gas containing hydrogen sulfide at an elevated temperature to form a sulfide-containing semiconductor material layer.

20 Claims, 24 Drawing Sheets

Related U.S. Application Data

(60) Provisional application No. 63/593,650, filed on Oct. 27, 2023, provisional application No. 63/365,055, filed on May 20, 2022.

(56) References Cited

U.S. PATENT DOCUMENTS

| | | | | |
|---|---|---|---|---|
| 11,378,701 | B2 | 7/2022 | Taherion et al. | |
| 11,953,452 | B2 * | 4/2024 | Marthandam | A61B 6/032 |
| 2008/0314435 | A1 * | 12/2008 | He | C01B 13/0207 136/246 |
| 2010/0193694 | A1 | 8/2010 | Chen et al. | |
| 2011/0139235 | A1 * | 6/2011 | Gossman | H10F 71/1257 257/E31.015 |
| 2013/0126999 | A1 | 5/2013 | Rusian et al. | |
| 2016/0172523 | A1 | 6/2016 | Chacinski et al. | |
| 2018/0024254 | A1 | 1/2018 | Roy et al. | |
| 2022/0107431 | A1 | 4/2022 | Taherion et al. | |
| 2023/0375729 | A1 | 11/2023 | Song et al. | |

OTHER PUBLICATIONS

Ballabriga, R. et al., "Photon Counting Detectors for X-Ray Imaging With Emphasis on CT," IEEE Transactions on Radiation and Plasma Medical Sciences, vol. 5, No. 4, pp. 422-440, Jul. 2021.

Baussens, O. et al., "Characterization of High-Flux CdZnTe with optimized electrodes for 4th generation synchrotrons," 23rd International Workshop on Radiation Imaging Detectors Jun. 26-30, 2022, Riva del Garda, Italy, 11 pages, https://doi.org/10.1088/1748-0221/17/11/C11008.

Boieriu, P. et al., "Wurtzite CdS on CdTe Grown by Molecular Beam Epitaxy," Journal of Electronic Materials, vol. 29, No. 6, pp. 718-722, 2000.

Garces, H. F. et al., "Low temperature H2S dry-desulfurization with zinc oxide," Microporous and Mesoporous Materials 127 (2010) pp. 190-197, doi: 10.1016/j.micromeso.2009.07.022.

Iniewski, K., "Czt sensors for Computed Tomography: from crystal growth to image quality," 18th International Workshop on Radiation Imaging Detectors, Jul. 3-7, 2016, Barcelona, Spain, 11 pages, doi:10.1088/1748-0221/11/12/C12034.

Kapadnis, R. S. et al., "Cadmium Telluride/Cadmium Sulfide Thin Films Solar Cells: A Review," ES Energy Environ., 2020, 10, 3-12, DOI: https://dx.doi.org/10.30919/esee8c706.

Kotina, I. M. et al., "Study of CdTe etching process in alcoholic solutions of bromine," Semicond. Sci. Technol. 13 (1998) 890-894.

Li, Y.H. et al., "Revised ab initio natural band offsets of all group IV, Ii-VI, and III-V semiconductors," Appl. Phys. Lett. 94, 212109 (2009), https://doi.org/10.1063/1.3143626.

Ma, L. et al., "Catalyst- and template-free low-tmperature in situ growth of n-type CdS nanowire on p-type CdTe film and p-n heterojunction properties," Scientific Reports | 6:38858 | 9 pages, DOI: 10.1038/srep38858 9.

Maloka, I. E. et al., "Thermal Decomposition of Hydrogen Sulphide by Cadmium Chalcogens," Petroleum Science and Technology, 24:1, 103-112, DOI: 10.1081/LFT-200041063.

Nelson, A. J. et al., "Novel method for growing CdS on CdTe surfaces for passivation of surface states and heterojunction formation," J. Vac. Sci. Technol. A 15, 1119-1123 (1997), https://doi.org/10.1116/1.580440.

Romeo, N. et al., "Last Progress in CdTe/CdS Thin Film Solar Cell Fabrication," Energy Procedia 57 ( 2014 ) 65-72, doi: 10.1016/j.egypro.2014.10.009.

Shinotsuka, H. et al., "Calculations of electron inelastic mean free paths. XII. Data for 42 inorganic compounds over the 50 eV to 200 keV range with the full Penn algorithm," Surf Interface Anal. 2019;51:427-457, DOI: 10.1002/sia.6598.

Tarasov, A. S. et al., "Preparation of Atomically Clean and Structurally Ordered Surfaces of Epitaxial CdTe Films for Subsequent Epitaxy," ISSN 1063-7826, Semiconductors, 2021, vol. 55, Suppl. 1, pp. S62-S66. © Pleiades Publishing, Ltd., 2021, Russian Text © The Author(s), 2021, published in Fizika i Tekhnika Poluprovodnikov, 2021, vol. 55, No. 9, pp. 748-753.

Thomas, B. et al., "Characterisation of Redlen high-flux CdZnTe," 11th International Conference on Position Sensitive Detectors Sep. 3-8, 2017, The Open University, Walton Hall, Milton Keynes, U.K, 14 pages, https://doi.org/10.1088/1748-0221/12/12/C12045.

Ma, L. et al., "Catalyst- and template-free low-temperature in situ growth of n-type CdS nanowire on p-type CdTe film and p-n heterojunction properties," Scientific Reports, vol. 6, No. 38858, 9 pages, (2016); https://doi.org/10.1038/srep38858.

Nelson, A.J. et al., "Novel method for growing CdS on CdTe surfaces for passivation of surface states and heterojunction formation," Journal of Vacuum Science & Technology A, vol. 15, No. 3, pp. 1119-1123, (1997); http://dx.doi.org/10.1116/1.580440.

* cited by examiner

RADIATION DETECTORS HAVING SULFIDE-CONTAINING ANODE CONTACTS AND METHODS OF FABRICATION THEREOF

RELATED APPLICATIONS

This application is a continuation-in-part of U.S. patent application Ser. No. 18/318,987, filed on May 17, 2023, which claims benefit of priority of U.S. Provisional Patent Application No. 63/365,055, filed May 20, 2022, and this application claims benefit of priority of U.S. Provisional Patent Application No. 63/593,650 filed on Oct. 27, 2023, the entire contents of all of which are incorporated by reference herein for all purposes.

FIELD

The present application is directed to the field of radiation detectors, and specifically to a radiation detector for ionizing radiation having asymmetric contacts.

BACKGROUND

High-energy detectors for detecting ionizing radiation can include a semiconductor material as a radiation-sensitive detector material within a radiation sensor. The semiconductor material generates an electron-hole-pair cloud when a high-energy photon or particle impinges thereupon. A bias voltage applied across an anode and a cathode induces electrons from the electron cloud to drift toward the anode, and holes toward the cathode, thereby generating detection current.

Radiation detectors detect presence of radiation by the electrical current generated by the radiation sensor. However, semiconductor materials of such sensors spontaneously generate electron-hole pairs due to thermal excitation. When biased, shot noise, generation-recombination noise and 1/f noise are generated due to the flow of current through the sensor. Thus, a radiation detector has an inherent noise signal generated by the spontaneous electron-hole pair generation and current flow. The electrical current generated by flow of electrons and/or holes flows through radiation sensors even when the radiation detectors are not subjected to any electromagnetic radiation, i.e., when the radiation detectors are placed in the dark. Such electrical current is commonly referred to as dark current or reverse bias leakage current.

Dark current is a source of undesirable noise in radiation detectors. Dark current can also have a negative effect on the performance of readout electronics used to detect the output of radiation sensors used in radiation detectors.

SUMMARY

According to one embodiment of the present disclosure, a radiation detector includes a radiation-sensitive semiconductor substrate, a cathode electrode disposed over a first surface of the radiation-sensitive semiconductor material substrate, and at least one anode electrode disposed over a second surface of the radiation-sensitive semiconductor material substrate, where the at least one anode electrode includes a semiconductor material layer including cadmium sulfide located between a metallic material and the semiconductor material substrate.

In one embodiment, the radiation-sensitive semiconductor substrate includes cadmium zinc telluride (CZT), and the semiconductor material layer includes $Cd_{1-x}Zn_xTe_yS_{1-y}$, where $0 \le x \le 0.1$ and $0 \le y \le 0.5$.

According to another embodiment of the present disclosure, a method of fabricating a radiation detector includes exposing a surface of a radiation-sensitive semiconductor material substrate to a gas containing hydrogen sulfide at an elevated temperature to form a sulfide-containing semiconductor material layer over the radiation-sensitive semiconductor material substrate, and forming a metallic material over the sulfide-containing semiconductor material layer to provide an anode electrode structure including the metallic material and the sulfide-containing semiconductor material over the surface of the radiation-sensitive semiconductor material substrate.

DETAILED DESCRIPTION

Figure 1:
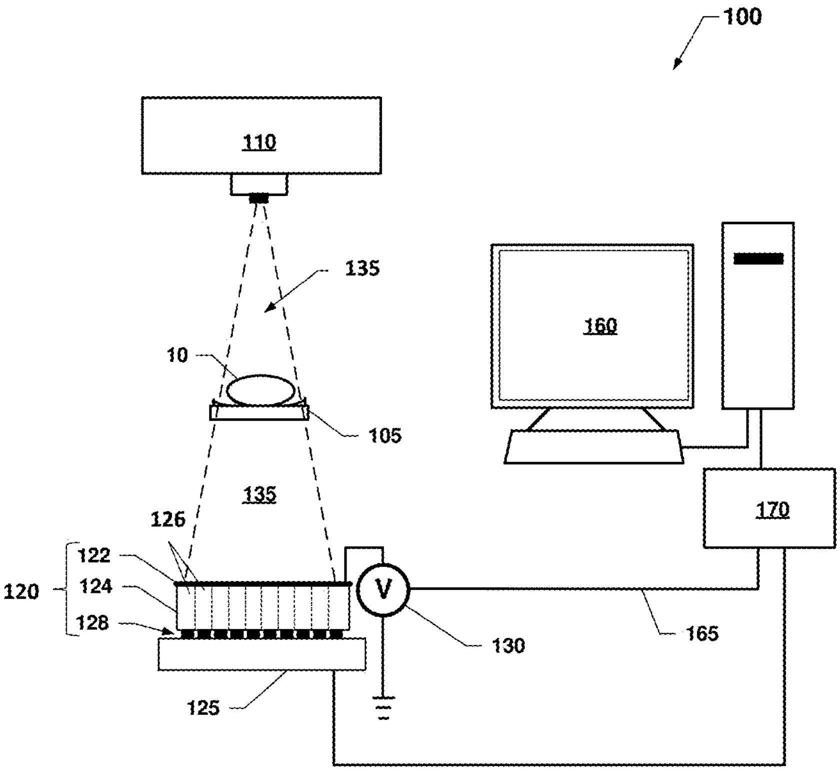
FIG. 1 is a functional block diagram of an example ionizing radiation imaging system in accordance with various embodiments.

Various embodiments of the present disclosure are directed to a radiation detector including asymmetric contacts, the various aspects of which are described herein in detail. In various embodiments, an asymmetric contact includes an electrical contact (e.g., a cathode or anode electrode) to a radiation-sensitive semiconductor material substrate that exhibits different blocking effects for charge carriers (i.e., holes or electrons) that are extracted by the contact from the radiation sensitive semiconductor material substrate relative to the opposite-type charge carrier that may be injected from the contact into the radiation-sensitive semiconductor material substrate. For example, for an anode contact, the charge carriers that are extracted from the radiation-sensitive semiconductor material substrate (i.e., the photocarriers) are electrons, and the charge carriers that may be injected from the anode contact into the radiation-sensitive semiconductor material substrate are the holes. An asymmetric anode contact may be non-blocking with respect to electron extraction (i.e., permits movement of electrons between the semiconductor material substrate and the contact) and may be blocking or partially blocking with respect to holes (i.e., restricts or inhibits movement of holes between the contact and the semiconductor material substrate).

For a cathode contact, the charge carriers that are extracted from the radiation-sensitive semiconductor material substrate are holes and the charge carriers that may be injected from the cathode contact into the radiation-sensitive semiconductor material substrate are electrons. An asymmetric cathode contact may be non-blocking with respect to hole extraction (i.e., permits movement of holes between the semiconductor material substrate and the contact) and may be blocking or partially blocking with respect to electrons (i.e., restricts or inhibits movement of electrons between the contact and the semiconductor material substrate).

An anode contact (i.e., an anode electrode) that is non-blocking with respect to electrons and is blocking or partially blocking with respect to holes may be referred to as an anode asymmetric blocking contact (anode ABC). A cathode contact (i.e., a cathode electrode) that is non-blocking with respect to holes and is blocking or partially blocking with respect to electrons may be referred to as a cathode asymmetric blocking contact (cathode ABC).

Embodiments of the present disclosure are also directed to injecting asymmetric contacts (IACs). An injecting asymmetric contact may be non-blocking with respect to charge carriers (i.e., holes or electrons) that are extracted by the contact from the radiation-sensitive semiconductor material substrate and may provide a controlled injection of the opposite-type charge carrier from the contact into the radiation-sensitive semiconductor material substrate. An anode injecting asymmetric contact (IAC) may be non-blocking with respect to electron extraction, and may enable a controlled amount of holes to be injected from the contact into the radiation-sensitive semiconductor material substrate. A cathode injecting asymmetric contact (IAC) may be non-blocking with respect to hole extraction, and may enable a controlled amount of electrons to be injected from the contact into the radiation-sensitive semiconductor material substrate.

The radiation detectors according to various embodiments may be used for imaging applications, including high-flux medical and/or industrial imaging applications, such as photon-counting computed tomography (PCCT) imaging, or other X-ray or gamma ray imaging. In one embodiment, a high-flux radiation detector is used to detect a high number of photon counts per second ("cps") striking the detector, such as at least $1\times10^6$ cps/mm$^2$ (i.e., $\geq1\times10^6$ cps/mm$^2$), including $1\times10^6$ cps/mm$^2$ to $1\times10^9$ cps/mm$^2$, for example $1\times10^6$ cps/mm$^2$ to $2.5\times10^8$ cps/mm$^2$. In one embodiment, the radiation source in high-flux applications is an X-ray source (e.g., X-ray tube). In contrast, in low-flux applications, such as positron emission tomography, the radiation source is a radioisotope.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims. Any reference to claim elements in the singular, for example, using the articles "a," "an," or "the" is not to be construed as limiting the element to the singular.

The terms "example," "exemplary," or any term of the like are used herein to mean serving as an example, instance, or illustration. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

As used herein, a configuration in which a first element that is formed or located "over" a second element is a configuration in which the first element and the second element are in a generally facing configuration, and may, or may not, have a direct contact (physical contact) between the first and second elements. A configuration in which a first element that is formed or located "on" a second element is a configuration in which the first element and the second element are attached to each other directly or through at least one intermediate element. A configuration in which a first element that is formed or located "directly on" a second element is a configuration in which the first element and the second element are in physical contact with each other. Ordinals such as "first" and "second" are employed merely to distinguish similar elements, and different ordinals may be employed to refer to same elements across the specification and the claims. A "top" side and a "bottom" side refer to relative orientations when a structure is viewed in a certain manner, and orientations of a structure and labeling of respective portions change upon rotation of the structure.

FIG. 1 is a functional block diagram of an example ionizing radiation imaging system in accordance with various embodiments. The illustrated example ionizing radiation imaging system is a CT imaging system 100 that includes an X-ray source 110 (i.e., a source of ionizing radiation), and a radiation detector 120. The CT imaging system 100 may additionally include a support structure 105, such as a table or frame, which may rest on the floor and may support an object 10 to be scanned. The support structure 105 may be stationary (i.e., non-moving) or may be configured to move relative to other elements of the CT imaging system 100. The object 10 may be all or a portion of any biological (e.g., human or animal patient) or non-biological (e.g., luggage) object to be scanned.

The X-ray source 110 is configured to deliver ionizing radiation to the radiation detector 120 by emitting an X-ray beam 135 toward the object 10 and the radiation detector 120. After the X-ray beam 135 is attenuated by the object 10, the beam of radiation 135 is received by the radiation detector 120. The radiation detector 120 includes at least one anode 128 and cathode 122 pair separated by a semiconductor material plate (e.g., semiconductor substrate) 124.

The radiation detector 120 may be controlled by a high voltage bias power supply 130 that selectively creates an electric field between an anode 128 and cathode 122 pair separated by a semiconductor material plate 124. The semiconductor material plate 124 may comprise any suitable semiconductor material for detecting X-ray radiation disposed between the anode 128 and cathode 122 and thus configured to be exposed to the electrical field therebetween. In various embodiments, the semiconductor material plate 124 may comprise a II-VI semiconductor material, such as cadmium telluride, cadmium zinc telluride (i.e., CdZnTe or "CZT"), cadmium selenide telluride, and cadmium zinc selenide telluride. Other suitable semiconductor materials are within the contemplated scope of disclosure.

In some embodiments, there may be a plurality of separate CZT pixels 126 (e.g., 4 to 1024, such as 256 to 864 pixels for example) in the semiconductor material plate 124, each containing and electrically connected to a separate anode 128. One or more cathodes 122 are provided for the plurality of CZT pixels 126. A read-out application specific integrated circuit (ASIC) 125 coupled to the anode(s) 128 and cathode 122 pair may receive signals (e.g., charge or current) from the anode(s) 128 and be configured to provide data to and be controlled by a control unit 170.

The control unit 170 may be configured to synchronize the X-ray source 110, the read-out ASIC 125, and the high voltage bias power supply 130. The control unit 170 may be coupled to and operated from a computing device 160. Alternatively, the computing device 160 and the control unit 170 may be integrated together as one device.

The object 10 may pass between the X-ray source 110 and the radiation detector 120 or alternatively the object 10 may remain stationary while the X-ray source 110 and the radiation detector 120 move relative to the object 10. Either way, the radiation detector 120 may capture incremental cross-sectional profiles of the object 10. The data acquired by the radiation detector 120 may be passed along to the computing device 160 that may be located remotely from the radiation detector 120 via a connection 165. The connection 165 may be any type of wired or wireless connection. If the connection 165 is a wired connection, the connection 165 may include a slip ring electrical connection between any structure (e.g., rotating ring/gantry) supporting the radiation detector 120 and a stationary support part of the support structure 105, which supports any part of the object 10. If the connection 165 is a wireless connection, then the ASIC 125 may contain any suitable wireless transceiver to communicate data with another wireless transceiver that is in communication with the computing device 160. The computing device 160 may include processing and imaging applications that analyze each profile obtained by the radiation detector 120, and a full set of profiles may be compiled to form two-dimensional images of cross-sectional slices of the object 10.

Various alternatives to the design of the CT imaging system 100 of FIG. 1 may be employed to practice embodiments of the present disclosure. CT imaging systems may be designed in various architectures and configurations. For example, a CT imaging system may have a helical architecture. In a helical CT imaging scanner, the X-ray source and detector array are attached to a freely rotating gantry. During a scan, a table (i.e., support structure 105) moves the object 10 smoothly through the scanner creating helical path traced out by the X-ray beam. Slip rings enable the transfer of power and data on and off the rotating gantry. In other embodiments, the CT imaging system may be a tomosynthesis CT imaging system. In a tomosynthesis CT scanner, the gantry may move in a limited rotation angle (e.g., between 15 degrees and 60 degrees) in order to detect a cross-sectional slice of the object. The tomosynthesis CT scanner may be able to acquire slices at different depths and with different thicknesses that may be constructed via image processing. In other embodiments, multiple X-ray sources are disposed at different angles with respect to the detector array. The X-ray sources are turned on sequentially, forming a series of transmission images through the object to be scanned. An image is then reconstructed without requiring any motion of X-ray sources and the detector array.

The detector array of a CT imaging system may include an array of radiation detector elements, referred to herein as pixel detectors. The signals from the pixel detectors may be processed by a pixel detector circuit, which may sort detected photons into energy bins based on the energy of each photon or the voltage generated by the received photon. When an X-ray photon is detected, its energy is determined and the X-ray photon count for its associated energy bin is incremented. For example, if the detected energy of an X-ray photon is 24 kilo-electron-volts (keV), the X-ray photon count for the energy bin of 20-40 keV may be incremented. The number of energy bins may range from one to several, such as two to six. In an illustrative example, an X-ray photon counting detector may have four energy bins: a first bin for detecting photons having an energy between 20 keV and 40 keV, a second bin for detecting photons having an energy between 40 keV and 60 keV, a third bin for detecting photons having an energy between 60 keV and 80 keV, and a fourth bin for detecting photons having an energy above 80 keV. The greater the total number of energy bins, the better the material discrimination.

In CT imaging systems, a scanned object is exposed to an X-ray beam and attenuated photons from the X-ray beam are detected and counted by individual radiation detector pixels in a detector array. When an object (e.g., the object 10) is loaded in a CT imaging system, the X-ray beam may be heavily attenuated, and the number of photons detected by the detector array may be orders of magnitude less than the number of photons emitted from an X-ray source. For image reconstruction purposes, the radiation detector can be exposed to a direct X-ray beam without an intervening object located inside the CT imaging system. In such cases, the X-ray photon count rates in the CT imaging system may reach values of 100 million counts per second per square millimeter (Mcps/mm$^2$) or more. The detector array should be capable of detecting such a wide range of photon count rates.

Figure 2A:
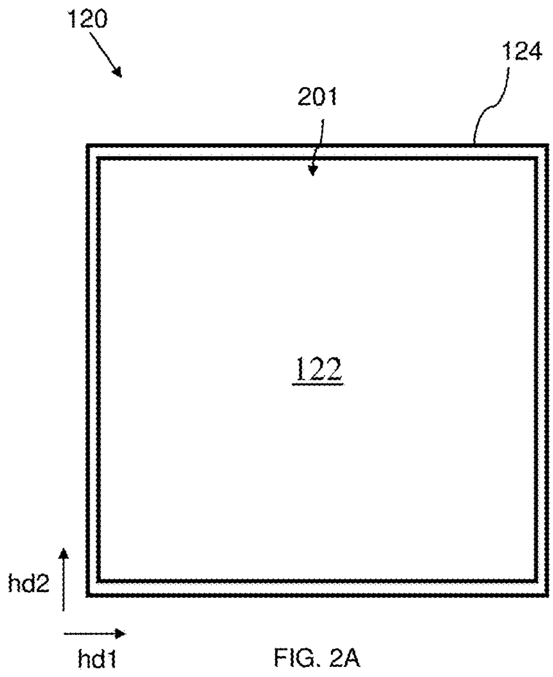
FIG. 2A is a schematic illustration of a first side of a radiation detector in accordance with various embodiments.
Figure 2B:
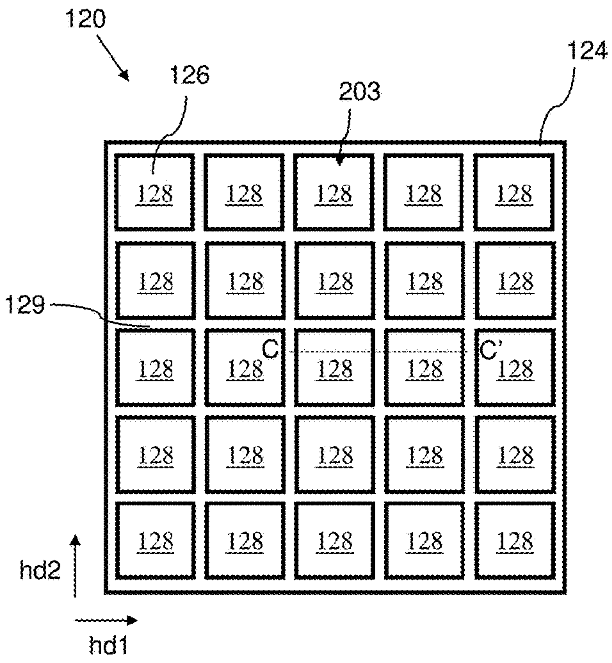
FIG. 2B is a schematic illustration of a second side of a radiation detector in accordance with various embodiments.

FIGS. 2A-2B schematically illustrate a radiation detector (such as a photon counting computed tomography radiation detector) 120 for an imaging system, such as a CT imaging system 100 as shown in FIG. 1. FIG. 2A illustrates a first (e.g., cathode) side 201 of the radiation detector 120, and FIG. 2B illustrates a second (e.g., anode) side 203 of the radiation detector 120, opposite the first side 201. The first side 201 of the radiation detector 120 may face towards the source of incident radiation (e.g., an X-ray source 110 as shown in FIG. 1) and may also be referred to as the "front" side 201 of the radiation detector 120. The second side 203 of the radiation detector 120 may face away from the source of incident radiation, and may also be referred to as the "back" side 203 of the radiation detector 120.

The radiation detector 120 includes a semiconductor material substrate 124 (e.g., a plate-shaped semiconductor substrate), such as a cadmium zinc telluride (CZT) substrate. Cathode and anode electrodes 122, 128 may be located over the semiconductor material substrate 124 on the first 201 and second 203 sides of the detector 120, respectively. As shown in FIG. 2A, the first side 201 of the radiation detector 120 may include a cathode electrode 122 comprised of an electrically conductive material. In the embodiment shown in FIG. 2A, the cathode electrode 122 may be a monolithic cathode electrode, meaning that a single cathode electrode 122 extends continuously over the surface of the semiconductor material substrate 124 on the first side 201 of the radiation detector 120. Alternately, the cathode electrode 122 may include a plurality of discrete segments of conductive material over the surface of the semiconductor material substrate 124.

Referring to FIG. 2B, the second side 203 of the radiation detector 120 may include an array of discrete anode electrodes 128 comprised of an electrically conductive material over the semiconductor material substrate 124, with gaps 129 between adjacent anode electrodes 128. Each anode electrode 128 may define a separate detector element (i.e., a pixel 126) of the radiation detector 120. As discussed above, a detector circuit, such as an application specific integrated circuit (ASIC) 125 shown in FIG. 1, may be electrically connected to the anode electrodes 128 and may be configured to read out electric signals (e.g., charge or current) for each pixel 126 of the radiation detector 120. The gaps 129 between the adjacent anode electrodes 128 may also be referred to as "streets" or "roads." The "streets" 129 may be arranged in a regular grid pattern, as shown in FIG. 2B. Other geometries for the anode electrodes 128 and the streets 129 are within the contemplated scope of this disclosure, including anode electrodes 128 having non-uniform and/or non-rectangular shapes (e.g., triangular, elliptical and/or irregularly shaped anodes), as well as streets 129 having non-uniform spacing and/or widths.

Figure 3:
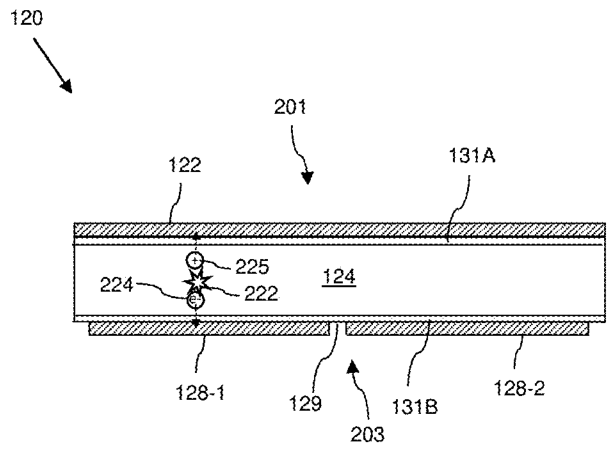
FIG. 3 (Prior Art)
FIG. 3 is a side cross-sectional view of a portion of a prior art radiation detector taken along plane C-C' in FIG. 2B.

FIG. 3 is a side cross-sectional view of a portion of a prior art radiation detector taken along plane C-C' in FIG. 2B. When a photon of radiation (e.g., X-ray radiation) is absorbed at a location 222 within the semiconductor material substrate 124, a cloud of electrons 224 is ejected into the conduction band of the semiconductor material. Each negatively charged ejected electron 224 creates a corresponding positively charged hole 225. Under the bias voltage applied between the cathode electrode 122 and the anode electrodes 128-1, 128-2, the cloud of electrons 224 drift toward the nearest anode electrode 128-1 where they are collected as a signal as described above. The corresponding holes 225 drift to the cathode electrode 122. Each of the anode electrodes 128-1, 128-2 may be electrically connected to a respective input channel of the detector read-out circuitry (e.g., ASIC 125 shown in FIG. 1). The detector circuitry may be configured to measure the total amount of the generated electron charge by integrating the current through the anode electrode 128-1, and thereby estimate the energy of the photon which impinged on the corresponding pixel 126 of the radiation detector 120.

The cathode electrode 122 and the anode electrodes 128-1, 128-2 are formed by coating the major surfaces of the semiconductor material substrate 124 with a metallic material using a suitable deposition process, and lithographically patterning the metallic material to form the cathode electrode 122 on the first side 201 of the radiation detector 120 and an array of anode electrodes 128-1, 128-2 on the second side 203 of the radiation detector 120.

A problem with some radiation detectors is that charge carriers, including electrons from the cathode electrode 122 and holes from the anode electrodes 128-1, 128-2, may be injected from the metallic material electrodes into the semiconductor material substrate 124 where they may contribute to high dark current within the radiation detector 120. Dark current is a source of undesirable noise in radiation detectors, and can also have a negative effect on the performance of the detector read-out circuitry. To inhibit the injection of charge carriers (i.e., electrons and holes) into the semiconductor material substrate 124, thin layers of dielectric material 131A, 131B are often provided over the major surfaces of the semiconductor material substrate 124 between the semiconductor material substrate 124 and the respective cathode and anode electrodes 122, 128, as shown in FIG. 3. The layers of dielectric material 131A, 131B may be a dielectric oxide of the semiconductor material of the substrate 124, and may be formed via surface oxidation of the semiconductor material substrate 124.

Figure 4A:
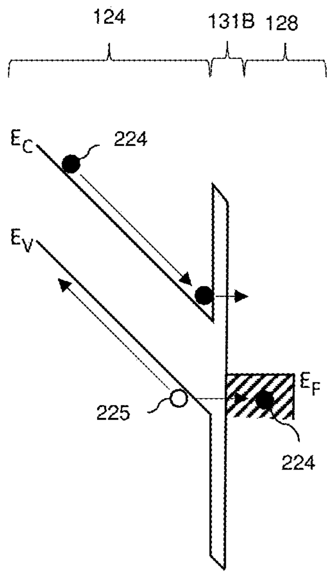
FIG. 4A is an energy band diagram of the metal-oxide-semiconductor (MOS) interface region on the anode-side of a radiation detector shown in FIG. 3.
Figure 4B:
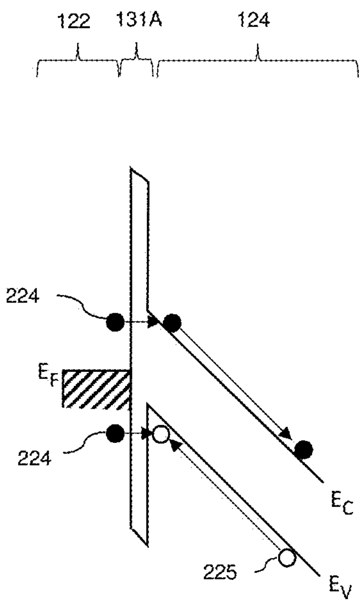
FIG. 4B is an energy band diagram of the metal-oxide-semiconductor (MOS) interface region on the cathode-side of a radiation detector shown in FIG. 3.

A problem with the prior art radiation detector 120 as shown in FIG. 3 is that providing the dielectric material layer 131A or 131B between the electrode and the semiconductor material substrate in order to suppress injection of one carrier makes extraction of the opposite carrier more difficult at the same time. For example, if the anode-side surface of the semiconductor material substrate 124 is oxidized to block hole injection from the anode electrodes 128, then the oxide layer 131B will also block the flow of photo-generated electrons to the anode electrodes 128. This is schematically illustrated in FIGS. 4A and 4B, which are energy band diagrams of the metal-oxide-semiconductor (MOS) interface regions on the anode-side (FIG. 4A) and the cathode-side (FIG. 4B) of a radiation detector 120 as shown in FIG. 3. In the energy band diagrams of FIGS. 4A and 4B, the semiconductor material substrate (e.g., CZT) is shown on the left in FIG. 4A and on the right in FIG. 4B, the dielectric material (e.g., oxide) layer 131A or 131B is in the middle, and the metallic material electrode (anode electrode 128 in FIG. 4A and cathode electrode 122 in FIG. 4B) is on the right in FIG. 4A and on the left in FIG. 4B. In each of the energy band diagrams of FIGS. 4A and 4B, $E_C$ is the lower edge of the conduction band, $E_V$ is the upper edge of the valence band, and $E_F$ is the Fermi level. Electrons 224 are depicted by solid circles (●) and holes 225 are depicted by hollow circles (○). The direction of the electric field in FIGS. 4A and 4B is the same as in normal operation of the radiation detector 120, with the cathode electrode 122 being negatively biased relative to the anode electrode 128.

Referring to FIG. 4A, hole injection occurs when an electron from the valence band, at an energy level within a few kT (i.e., Boltzmann constant x absolute temperature) of the Fermi level in the metal, escapes from the semiconductor material substrate 124 to the metallic anode electrode 128, creating a hole that travels towards the cathode (i.e., to the left in FIG. 4A). The presence of the dielectric material layer 131B suppresses such injections due to the much higher energy gap of the dielectric material relative to the semiconductor material. At the same time, however, during operation of the radiation detector 120, electrons arrive at the interface between the semiconductor material substrate 124 and the dielectric material layer 131B from the left due to the creation of photoelectrons following absorption of X-rays, i.e., from X-ray interaction events. These electrons are impeded from escaping the semiconductor material substrate by the same dielectric material barrier 131B and tend to accumulate at the semiconductor-dielectric interface. In the presence of an ongoing X-ray flux, this accumulation continues until such time as the presence of the electrons at or near the semiconductor-dielectric interface causes electric fields that reduce the barrier that prevents the electrons from leaving the interface, allowing electrons to escape. Unfortunately, the accompanying electric field change reduces the effectiveness of the hole-blocking barrier 131B, allowing hole injection to increase. This is undesirable because it creates a DC current flow that causes energy estimation errors in the detector read-out circuitry (e.g., ASIC) due to baseline shift. If uncompensated, this excess photocurrent may cause counting instability, generally resulting in increasing counts. This change in electric field in the bulk semiconductor material near the anode electrode 128 can change the risetime of the signal detected by the ASIC, which can result in charge estimation errors, although it is normally very small and has an opposite sign to the impact of uncompensated excess photocurrent.

It is possible to compensate for DC currents, such as the excess photocurrent, with compensation circuitry known as dark current compensation or alternatively baseline shift correction circuitry, depending upon the exact circuit configuration. However, such circuitry is difficult to design, and increases noise even in cases in which the compensation circuitry functions perfectly because of the increase in shot noise accompanying the flowing DC currents. This is the case even when the DC component of the current from the detector exactly matches that from the compensation circuitry. Accordingly, there are significant drawbacks to the use of a dielectric material layer between the semiconductor material substrate and the metallic electrodes to reduce dark current.

Referring to FIG. 4B, an analogous phenomenon occurs at the cathode-side of the radiation detector. Electron injection occurs when an electron from the cathode electrode 122 passes into the semiconductor material substrate 124. This electron injection is impeded by the presence of the dielectric material layer 131A. This is generally desirable as it suppresses dark current in the radiation detector. During operation of the radiation detector, holes 125 generated from X-ray interaction events arrive at the cathode electrode 122 from the right as shown in FIG. 4B. The dielectric material layer 131A impedes the holes from exiting to the cathode electrode 122. This can lead to the accumulation of holes at the semiconductor-dielectric interface. Such accumulation can result in the generation of electric fields that decrease the effectiveness of the electron blocking, which can result in excess photocurrent, which is undesirable for the same reasons as discussed above in connection with the anode-side of the radiation detector.

In the example shown in FIGS. 4A and 4B, the energy bandgaps of the semiconductor material substrate 124 and the dielectric material layers 131A, 131B, as well as the conduction-band offset from the semiconductor material substrate 124 to the dielectric material layer and the position of the Fermi level with respect to the mid-gap of the semiconductor material substrate 124 in the absence of an electric field, are the same at both the anode-side and the cathode-side of the radiation detector. This is typical for prior art radiation detectors shown in FIG. 3, which for ease-of-manufacture include identical dielectric barrier layers (e.g., surface oxide layers) and utilize the same metallic electrode material on both the anode-side and the cathode-side of the radiation detector. Accordingly, the blocking effect on charge carriers at the anode-side of the radiation detector (including blocking of both injected holes flowing from the anode electrode and photo-generated electrons flowing to the anode electrode) is substantially similar to the blocking effect on charge carriers at the cathode-side of the radiation detector (including blocking of both injected electrons flowing from the cathode electrode and photo-generated holes flowing to the cathode electrode). Thus, a prior art radiation detector as shown in FIG. 3 may be referred to as a Dual Blocking Contact (DBC) radiation detector since both electrons and holes are similarly blocked at the anode-side and cathode-side electrical contacts.

Various embodiments include radiation detectors including a radiation-sensitive semiconductor material substrate, such as a CZT substrate, and asymmetric blocking contacts located over opposite surfaces of the radiation-sensitive semiconductor material substrate. As discussed above, an asymmetric blocking contact (ABC) includes an electrical contact (e.g., a cathode or anode electrode) to a radiation-sensitive semiconductor material substrate that exhibits different blocking effects for charge carriers (i.e., holes or electrons) that are extracted by the contact from the radiation sensitive semiconductor material substrate relative to the opposite-type charge carrier that may be injected from the contact into the radiation-sensitive semiconductor material substrate.

Figure 5:
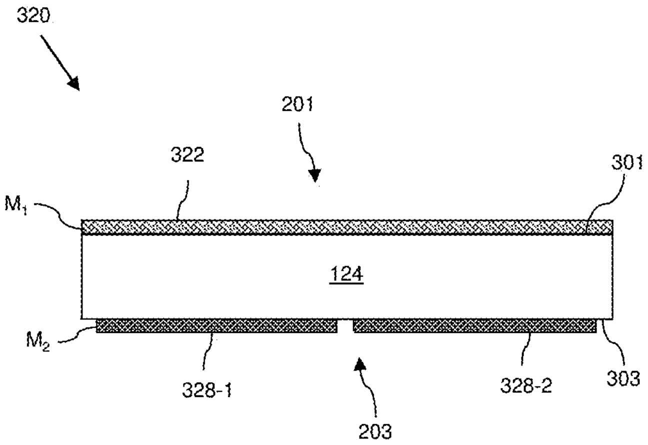
FIG. 5 is a side cross-sectional view of radiation detector including asymmetric blocking contacts (ABCs) according to an embodiment of the present disclosure.

FIG. 5 is a side cross-sectional view of radiation detector 320 according to an embodiment of the present disclosure. Referring to FIG. 5, the radiation detector 320 may be similar to the radiation detector 120 shown in FIGS. 2A, 2B and 3, and may include a semiconductor material substrate 124 (e.g., a plate-shaped semiconductor substrate), such as a cadmium zinc telluride (CZT) substrate. A cathode electrode 322 may be located over a first surface 301 of the semiconductor material substrate 124 on a first side 201 of the radiation detector 320. A plurality of anode electrodes 328-1, 328-2 may be located over a second surface 303 of the semiconductor material substrate 124 on a second side 203 of the radiation detector 320. The cathode electrode 322 and the anode electrodes 328-1, 328-2 may include a metallic material. As used herein, a "metallic material" includes an electrically conductive material (i.e., having an electrical conductivity greater than $1.0\times10^5$ S/cm) including at least one metal element therein. Thus, a metallic material may include an elemental metal, an alloy of two or more metals, or an alloy of a metal with one or more metal or non-metal elements. In various embodiments, the metallic material ($M_1$) of the cathode electrode 322 may have a different material composition than the metallic material ($M_2$) of the anode electrodes 328-1, 328-2. In some embodiments, the metallic material ($M_1$) of the cathode electrode may directly contact the first surface 301 of the semiconductor material substrate 124. In some embodiments, the metallic material ($M_2$) of the anode electrodes 328-1, 328-2 may directly contact the second surface 303 of the semiconductor material substrate 124. In various embodiments, the radiation detector 320 may either include or exclude a dielectric material layer, such as an oxide layer, located between the first surface 301 of the semiconductor material substrate 124 and the cathode electrode 322 and/or between the second surface 303 of the semiconductor material substrate 124 and the anode electrodes 328-1, 328-2.

The metallic materials, $M_1$ and $M_2$, of the cathode and anode electrodes 322, 328-1, 328-2 in the embodiment radiation detector 320 may be configured to block or suppress the injection of dark current from the cathode and anode electrodes 322, 328-1, 328-2 to the semiconductor material substrate 124 while simultaneously allowing charge carriers generated in the semiconductor material substrate 124 due to photon interaction events (i.e., photocurrent) to be collected at the cathode and anode electrodes 322, 328-1, 328-2. Accordingly, both the cathode electrode 322 and the anode electrodes 328-1, 328-2 of the embodiment radiation detector 320 illustrated in FIG. 5 may be referred to as an asymmetric blocking contacts (ABCs).

Figure 6:
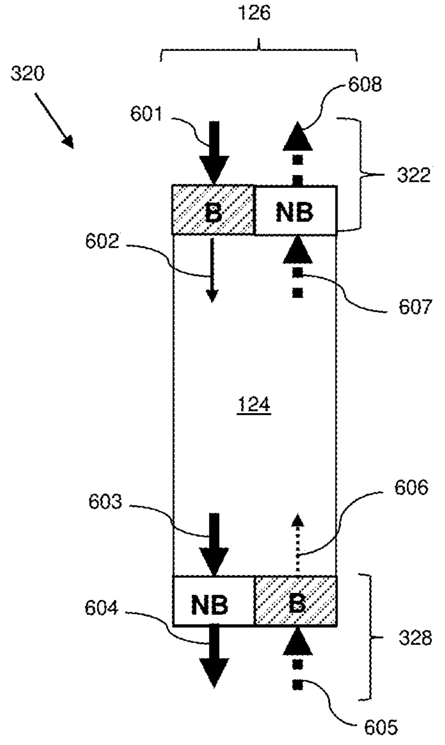
FIG. 6 is a cross-section view of an individual detector pixel of a radiation detector having asymmetric blocking contacts schematically illustrating the flow of charge carriers in the radiation detector.

The flow of charge carriers (electrons and holes) of the radiation detector 320 having asymmetric blocking contacts (ABCs) is schematically illustrated in FIG. 6, which is a schematic cross-section view of an individual detector pixel 126 of the radiation detector 320 including a cathode electrode 322 including a first metallic material ($M_1$) directly contacting a first surface 301 of a semiconductor material substrate 124, and an anode electrode 328 including a second metallic material ($M_2$) directly contacting a second surface 303 of the semiconductor material substrate 124. The solid arrows 601, 602, 603 and 604 on the left-hand side of FIG. 6 schematically illustrate the flow of electrons in the radiation detector 320, and the dashed arrows 605, 606, 607 and 608 on the right-hand side of FIG. 6 schematically illustrate the flow of holes in the ABC radiation detector 320.

Referring to FIG. 6, at the cathode-side of the radiation detector 320, electrons (indicated by the large arrow 601) are blocked from being injected into the semiconductor material substrate 124 by the cathode electrode 322. Thus, only a small portion of electrons (indicated by the small arrow 602) or no electrons are able to pass from the cathode electrode 322 to the semiconductor material substrate 124, resulting in a reduction in dark current. At the same time, holes (indicated by large arrow 607) flow through the semiconductor material substrate 124 and arrive at the cathode electrode 322. The flow of holes indicated by arrow 607 includes holes resulting from photon interaction events occurring within the semiconductor material substrate 124 as well as a much smaller portion of holes due to dark current within the semiconductor material substrate 124. The holes are able to pass from the semiconductor material substrate 124 to the cathode electrode 322 (indicated by large arrow 608) without significant blocking. Accordingly, the cathode electrode 322 may be considered blocking with respect to electrons (schematically indicated by the hatched region "B" in FIG. 6) and may be considered non-blocking with respect to holes (schematically indicated by the region labeled "NB" in FIG. 6).

At the anode-side of the radiation detector 320, holes (indicated by the large arrow 605) are blocked from being injected into the semiconductor material substrate 124 by the anode electrode 328. Thus, only a small portion of holes (indicated by the small arrow 606) or no holes are able to pass from the anode electrode 328 to the semiconductor material substrate 124, resulting in a reduction in dark current. At the same time, electrons flow through the semiconductor material substrate 124 (indicated by large arrow 603) and arrive at the anode electrode 328. The flow of electrons indicated by arrow 603 includes electrons resulting from photon interaction events occurring within the semiconductor material substrate 124 as well as a much smaller portion of electrons due to dark current within the semiconductor material substrate 124. The electrons are able to pass from the semiconductor material substrate 124 to the anode electrode 328 (indicated by large arrow 604) without significant blocking, and thus these electrons contribute to the detected photocurrent signal. Accordingly, the anode electrode 328 is blocking with respect to holes (schematically indicated by the hatched region "B" in FIG. 6) and is non-blocking with respect to electrons (schematically indicated by the region labeled "NB" in FIG. 6).

In various embodiments illustrated in FIGS. 5 and 6, the metallic material ($M_1$) of the cathode electrode 322 of the radiation detector 320 may have a work function $\Phi_1$ that is ≥4.6 eV. The use of a metallic material ($M_1$) having a relatively high work function $\Phi_1$ may provide a cathode electrode 322 that is blocking with respect to electrons and non-blocking with respect to holes. This is due to surface band bending that suppresses electron injection from the cathode electrode 322 to the semiconductor material substrate 124, but enables photogenerated holes to be easily extracted at the cathode electrode 322. In various embodiments, the high work function metallic material ($M_1$) of the cathode electrode 322 may directly contact the semiconductor material substrate 124 with no interfacial layer or material located between the metallic material ($M_1$) of the cathode electrode 322 and the semiconductor material substrate 124. In some embodiments, the work function $\Phi_1$ of the metallic material ($M_1$) of the cathode electrode 322 may be >5.0 eV, such as 5.1 eV to 6 eV. Suitable high work function metallic materials ($M_1$) for the cathode electrode 322 may include, for example, gold (Au), nickel (Ni) or platinum (Pt). Other suitable high work function metallic materials, including metals and alloys containing at least one metal and at least one other metal or non-metal element, are within the contemplated scope of disclosure. Examples of other high work function materials include, but are not limited to cobalt, iridium, osmium, or palladium.

In various embodiments, the metallic material ($M_2$) of the anode electrode(s) 328 of the radiation detector 320 may have a work function $\Phi_2$ that is <4.6 eV. The use of a metallic material ($M_2$) having a relatively low work function $\Phi_2$ may provide an anode electrode 328 that is blocking with respect to holes and non-blocking with respect to electrons. This is due to surface band bending that suppresses hole injection from the cathode electrode 322 to the semiconductor material substrate 124, but enables photogenerated electrons to be easily extracted at the anode electrode 328. In various embodiments, the lower work function metallic material ($M_2$) of the anode electrode 328 may directly contact the semiconductor material substrate 124 with no interfacial layer or material located between the metallic material ($M_2$) of the anode electrode 328 and the semiconductor material substrate 124. In some embodiments, the work function 2 of the metallic material ($M_2$) of the anode electrode 328 may be <4.3 eV, such as 4.2 eV to 2.5 eV. Suitable low work function metallic materials ($M_2$) for the anode electrode 328 may include, for example, titanium (Ti), aluminum (Al), indium (In), or chromium (Cr). Other suitable low work function metallic materials, including metals and alloys containing at least one metal and at least one other metal or non-metal element, are within the contemplated scope of disclosure. Examples of other low work function materials include, but are not limited to manganese, hafnium, tin, lead, strontium or tantalum.

Figure 7:
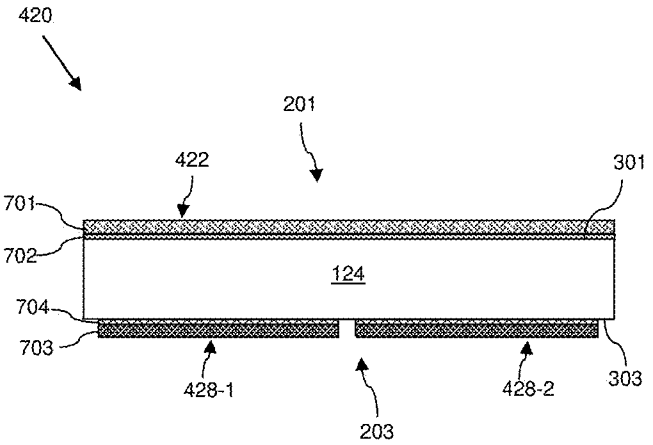
FIG. 7 is a side cross-sectional view of a radiation detector having asymmetric blocking contacts (ABCs) according to another embodiment of the present disclosure.

FIG. 7 is a side cross-sectional view of a radiation detector 420 having asymmetric blocking contacts (ABCs) according to another embodiment of the present disclosure. Referring to FIG. 7, the radiation detector 420 includes a semiconductor material substrate 124 (e.g., a plate-shaped semiconductor substrate), such as a cadmium zinc telluride (CZT) substrate. A cathode electrode 422 is located over a first surface 301 of the semiconductor material substrate 124 on a first side 201 of the radiation detector 420. A plurality of anode electrodes 428-1, 428-2 are located over a second surface 303 of the semiconductor material substrate 124 on a second side 203 of the radiation detector 420.

In the embodiment shown in FIG. 7, the cathode electrode 422 includes a metallic material layer 701 and a semiconductor material layer 702 located between the metallic material layer 701 and the first surface 301 of the semiconductor material substrate 124. In some embodiments, the semiconductor material layer 702 of the cathode electrode 422 may directly contact the first surface 301 of the semiconductor material substrate 124. The anode electrodes 428-1, 428-2 each include a metallic material layer 703 and a semiconductor material layer 704 located between the metallic material layer 701 and the second surface 303 of the semiconductor material substrate 124. In some embodiments, the semiconductor material layer 704 of each of the anode electrodes 428-1, 428-2 may directly contact the second surface 303 of the semiconductor material substrate 124.

The semiconductor material layer 702 of the cathode electrode 422 may provide a barrier layer between the metallic material layer 701 of the cathode electrode 422 and semiconductor material substrate 124 that may facilitate blocking of electrons from the cathode electrode 422 to the semiconductor material substrate 124 and passage (i.e., non-blocking) of holes from the semiconductor material substrate 124 to the cathode electrode 422. Similarly, the semiconductor material layer 704 of each of the anode electrodes 428-1, 428-2 may provide a barrier layer between the metallic material layer 703 of the anode electrode 428-1, 428-2 and semiconductor material substrate 124 that may facilitate blocking of holes from the anode electrode 428-1, 428-2 to the semiconductor material substrate 124 and passage (i.e., non-blocking) of electrons from the semiconductor material substrate 124 to the anode electrode 428-1, 428-2.

The semiconductor material layer 702 of the cathode electrode 422 may have a different composition than the composition of the semiconductor material layer 704 of the anode electrodes 428-1, 428-2. Both the semiconductor material layer 702 of the cathode electrode 422 and the semiconductor material layer 704 of the anode electrodes 428-1, 428-2 may have a different composition than the composition of the semiconductor material substrate 124 (e.g., CZT).

Figure 8A:
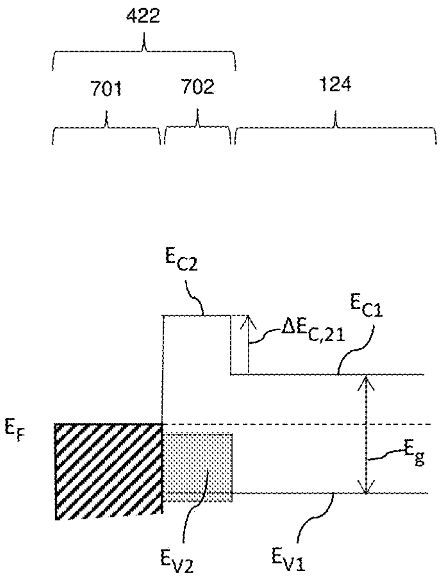
FIG. 8A is an energy band diagram of the cathode-side of the radiation detector of FIG. 7.

In various embodiments, the semiconductor material of semiconductor material layer 702 of the cathode electrode 422 may have a relatively high conduction band offset relative to the semiconductor material of the semiconductor material substrate 124. In other words, the conduction band edge of the material of the semiconductor material layer 702 is higher than the conduction band edge of the material of the semiconductor material substrate 124. FIG. 8A is an energy band diagram of the cathode-side of the radiation detector 420, where the semiconductor substrate 124 is shown on the right, the semiconductor material layer 702 of the cathode electrode 422 is in the middle, and the metallic material layer 701 of the cathode electrode 422 is on the left. The semiconductor material substrate 124 in this example is composed of $Cd_{0.9}Zn_{0.1}Te$ having a band gap ($E_g$) of ~1.57 eV between the conduction band edge $E_{C1}$ and the valence band edge $E_{V1}$ at room temperature. Other CZT materials, such as $Cd_{1-x}Zn_xTe$ may also be used, where $0.05 \leq x \leq 0.2$. $E_{C1}$ is the conduction band edge of the CZT semiconductor material substrate 124 and $E_{V1}$ is the valence band edge of the semiconductor material substrate 124. $E_{C2}$ is the conduction band edge of the semiconductor material layer 702 and $E_{V2}$ is the valence band edge of the semiconductor material layer 702. $\Delta E_{C,21}$ is the conduction band offset energy of the semiconductor material layer 702 relative to the semiconductor material substrate 124, and is defined as $\Delta E_{C,21} = E_{C2} - E_{C1}$. $E_F$ is the Fermi level of the metallic material layer 701. As illustrated in FIG. 8A, the conduction band edge $E_{C2}$ of the semiconductor material layer 702 is offset above (i.e., higher than) the conduction band edge $E_{C1}$ of the semiconductor material substrate 124 by the conduction band offset energy, $\Delta E_{C,21}$. In various embodiments, the conduction band offset energy $\Delta E_{C,21}$ may be ≥0.3 eV, such as 0.3 eV to 1.5 eV (i.e., higher than the kT=0.026 eV potential barrier height at room temperature which prevents or reduces electron "jumping" over the potential barrier). The conduction band offset between the semiconductor material layer 702 and the semiconductor material substrate 124 may inhibit electrons from the metallic material layer 701 of the cathode electrode 422 from passing through to the semiconductor material substrate 124, which may help to reduce dark current in the radiation detector.

The shaded area in FIG. 8A illustrates a number of possible locations for the valence band edge $E_{V2}$ of the semiconductor material layer 702. The valence band edge $E_{V2}$ of the semiconductor material layer 702 may be above (i.e., higher than) the valence band edge $E_{V1}$ of the semiconductor material substrate 124, the same as the valence band edge $E_{V1}$ of the semiconductor material substrate 124, or below (i.e., lower than) the valence band edge $E_{V1}$ of the semiconductor material substrate 124. In general, the valence band edge $E_{V2}$ of the semiconductor material layer 702 may be below (i.e., lower than) the conduction band edge $E_{C1}$ of the semiconductor material substrate 124, and is preferably below (i.e., lower than) the Fermi level $E_F$. In embodiments in which the valence band edge $E_{V2}$ of the semiconductor material layer 702 is below (i.e., lower than) the valence band edge $E_{V1}$ of the semiconductor material substrate 124, the valence band edge $E_{V2}$ of the semiconductor material layer 702 is preferably lower than the valence band edge $E_{V1}$ of the semiconductor material substrate 124 by less than 0.1 eV (i.e., by 0 to 0.09 eV). The relative locations of the valence band edge $E_{V2}$ of the semiconductor material layer 702 and the valence band edge $E_{V1}$ of the semiconductor material substrate 124 may allow holes to easily pass from the semiconductor material substrate 124 though the semiconductor material layer 702 to the metallic material layer 701 of the cathode electrode 422.

The semiconductor material layer 702 of the cathode electrode 422 of the radiation detector 420 shown in FIG. 7 may include a suitable semiconductor material having a sufficiently high conduction band offset (e.g., ≥0.3 eV) with respect to the semiconductor material of the semiconductor material substrate 124. Suitable semiconductor materials for the semiconductor material layer 702 of the cathode electrode 422 include, without limitation, zinc telluride (ZnTe), beryllium telluride (BeTe), $CuAlTe_2$, $Ag_3PS_4$, $BaAg_2S_2$, or $Ag_3PSe_4$. Other suitable semiconductor materials are within the contemplated scope of disclosure. The semiconductor materials used for semiconductor material layer 702 of the cathode electrode 422 may be doped or undoped, have an amorphous or crystalline structure, and/or may have a stochiometric or non-stochiometric composition.

The semiconductor material layer 702 of the cathode electrode 422 may have a thickness that is greater than the tunneling thickness. In some embodiments, the thickness of the semiconductor material layer 702 may be between about 0.3 nm and about 1,000 nm, such as between about 1 nm and about 500 nm, including between about 5 nm and about 100 nm.

The metallic material layer 701 of the cathode electrode 422 may include any suitable metallic material(s). In some embodiments, the metallic material layer 701 of the cathode electrode 422 may include a metallic material having a work function $\Phi_1$ that is ≥4.6, such as >5.0. Suitable metallic materials for the metallic material layer may include, for example, gold (Au), nickel (Ni) or platinum (Pt). Other metallic materials, including metals and alloys containing at least one metal and at least one other metal or non-metal element, are within the contemplated scope of disclosure.

Figure 8B:
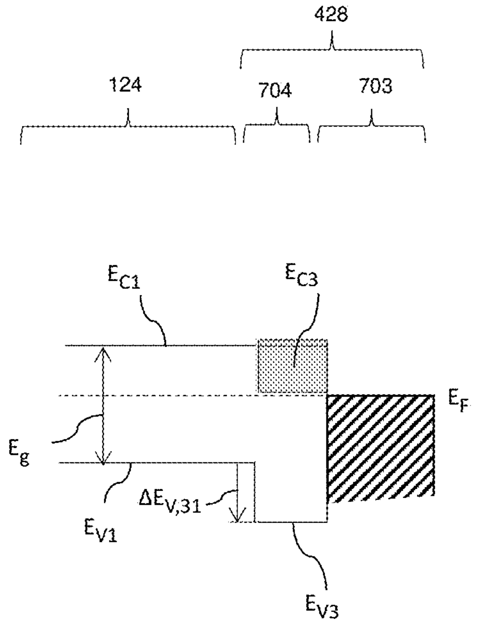
FIG. 8B is an energy band diagram of the anode-side of the radiation detector of FIG. 7.

Referring again to FIG. 7, in various embodiments, the semiconductor material of the semiconductor material layer 704 of the anode electrodes 428-1,428-2 of the radiation detector 420 may have a relatively high valence band offset relative to the semiconductor material of the semiconductor material substrate 124. FIG. 8B is an energy band diagram of the anode-side of the radiation detector 420, where the semiconductor substrate 124 is shown on the left, the semiconductor material layer 704 of the anode electrode 428 is in the middle, and the metallic material layer 703 of the anode electrode 428 is on the right. The semiconductor material substrate 124 in this example is composed of $Cd_{0.9}Zn_{0.1}Te$ having a band gap ($E_g$) of ~1.57 eV between the conduction band edge $E_{C1}$ and the valence band edge $E_{V1}$ at room temperature. $E_{V1}$ is the valence band edge of the CZT semiconductor material substrate 124 and $E_{C1}$ is the conduction band edge of the semiconductor material substrate 124. $E_{V3}$ is the valence band edge of the semiconductor material layer 704 and $E_{C3}$ is the conduction band edge of the semiconductor material layer 704. $\Delta E_{V,31}$ is the valence band offset energy of the semiconductor material layer 704 relative to the semiconductor material substrate 124, and is defined as $\Delta E_{V,31}=E_{V1}-E_{V3}$. Thus, $\Delta E_{V,31}$ is positive when $E_{V3}$ is below (i.e., lower than) $E_{V1}$, since moving down (i.e., lower) in the energy diagram indicates a higher hole energy. $E_F$ is the Fermi level of the metallic material layer 703. As illustrated in FIG. 8B, the valence band edge $E_{V3}$ of the semiconductor material layer 704 is below (i.e., lower than) the valence band edge $E_{V1}$ of the semiconductor material substrate 124 by a valence band offset energy, $\Delta E_{V,31}$. In various embodiments, the valence band offset energy $\Delta E_{V,31}$ may be ≥0.3 eV such as 0.3 eV to 1.5 eV (i.e., higher than the kT=0.026 eV potential barrier height at room temperature which prevents or reduces hole "jumping" over the potential barrier). The valence band offset between the semiconductor material layer 704 and the semiconductor material substrate 124 may inhibit holes from the metallic material layer 703 of the anode electrode 428 from passing through to the semiconductor material substrate 124, which may help to reduce dark current in the radiation detector.

The shaded area in FIG. 8B illustrates a number of possible locations for the conduction band edge $E_{C3}$ of the semiconductor material layer 704 of the anode electrode 428. The conduction band edge $E_{C3}$ of the semiconductor material layer 704 may be below (i.e., lower than), above (i.e., higher than) or the same as the conduction band edge $E_{C1}$ of the semiconductor material substrate 124. In general, the conduction band edge $E_{C3}$ of the semiconductor material layer 704 may be above (i.e., higher than) the valence band edge $E_{V1}$ of the semiconductor material substrate 124, and is preferably above (i.e., higher than) the Fermi level $E_F$. In embodiments in which the conduction band edge $E_{C3}$ of the semiconductor material layer 704 is above (i.e., higher than) the conduction band edge $E_{C1}$ of the semiconductor material substrate 124, the conduction band edge $E_{C3}$ of the semiconductor material layer 704 is preferably higher than the conduction band edge $E_{C1}$ of the semiconductor material substrate 124 by less than 0.1 eV (e.g., by 0 eV to 0.09 eV). The relative locations of the conduction band edge $E_{C3}$ of the semiconductor material layer 704 and the conduction band edge $E_{C1}$ of the semiconductor material substrate 124 may permit electrons to easily pass from the semiconductor material substrate 124 though the semiconductor material layer 704 to the metallic material layer 703 of the anode electrode 428.

The semiconductor material layer 704 of the anode electrodes 428-1, 428-2 of the radiation detector 420 shown in FIG. 7 may include a suitable semiconductor material having a sufficiently high valence band offset (e.g., ≥0.3 eV) with respect to the semiconductor material of the semiconductor material substrate 124. Suitable semiconductor materials for the semiconductor material layer 704 of the anode electrodes 428-1, 428-2 include, without limitation, cadmium oxide (CdO), zinc oxide (ZnO), cadmium sulfide (CdS), cadmium selenide (CdSe), titanium oxide ($TiO_2$), tin oxide ($SnO_2$), or indium oxide ($In_2O_3$). Other suitable semiconductor materials are within the contemplated scope of disclosure. The semiconductor materials used for semiconductor material layer 704 of the anode electrodes 428-1, 428-2 may be doped or undoped, have an amorphous or crystalline structure, and/or may have a stochiometric or non-stochiometric composition.

The semiconductor material layer 704 of the anode electrodes 428-1, 428-2 may have a thickness that is greater than the tunneling thickness. In some embodiments, the thickness of the semiconductor material layer 704 may be between about 0.3 nm and about 1,000 nm, such as between about 1 nm and about 500 nm, including between about 5 nm and about 100 nm.

The metallic material layer 703 of the anode electrodes 428-1, 428-2 may include any suitable metallic material(s). In some embodiments, the metallic material layer 703 of the anode electrodes 428-1, 428-2 may include a metallic material having a work function $\Phi_2$ that is <4.6. Suitable metallic materials for the metallic material layer may include, for example, titanium (Ti), aluminum (Al), indium (In), or chromium (Cr). Other metallic materials, including metals and alloys containing at least one metal and at least one other metal or non-metal element, are within the contemplated scope of disclosure.

Figure 9:
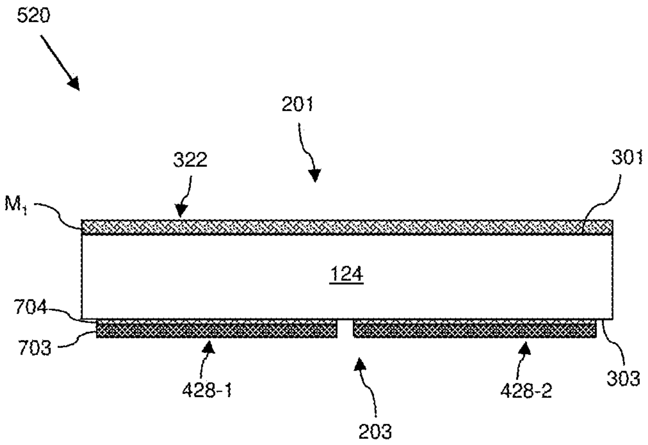
FIG. 9 is a side cross-sectional view of a radiation detector having asymmetric blocking contacts (ABCs) according to another embodiment of the present disclosure.

FIG. 9 is a side cross-sectional view of a radiation detector 520 having asymmetric blocking contacts (ABCs) according to another embodiment of the present disclosure. Referring to FIG. 9, the radiation detector 520 includes a semiconductor material substrate 124 (e.g., a plate-shaped semiconductor substrate), such as a cadmium zinc telluride (CZT) substrate. The radiation detector 520 includes a cathode electrode 322 located over a first surface 301 of the semiconductor material substrate 124 on a first side 201 of the radiation detector 520. The cathode electrode 322 includes a first metallic material ($M_1$) directly contacting the first surface 301 of the semiconductor material substrate 124, such as described above with reference to FIG. 5. In various embodiments, the metallic material ($M_1$) of the cathode electrode 322 may have a work function $\Phi_1$ that is ≥4.6 eV, including >5 eV. The cathode electrode 322 may be blocking with respect to electrons and non-blocking with respect to holes.

The radiation detector 520 may also include a plurality of anode electrodes 428-1, 428-2 are located over a second surface 303 of the semiconductor material substrate 124 on a second side 203 of the radiation detector 520. Each of the anode electrodes 428-1, 428-2 may include a metallic material layer 703 and a semiconductor material layer 704 located between the metallic material layer 703 and the second surface 303 of the semiconductor material substrate 124, as described above with reference to FIG. 7. In various embodiments, the semiconductor material layer 704 may directly contact the second surface 303 of the semiconductor material substrate 124. In some embodiments, the semiconductor material layer 704 may include a semiconductor material having a valence band offset of 0.3 eV or more with respect to the semiconductor material of the semiconductor material substrate 124. In some embodiments, the metallic material layer 703 of the anode electrodes 428-1, 428-2 may include a metallic material having a work function $\Phi_2$ that is <4.6. The anode electrodes 428-1, 428-2 may be blocking with respect to holes and non-blocking with respect to electrons.

Figure 10:
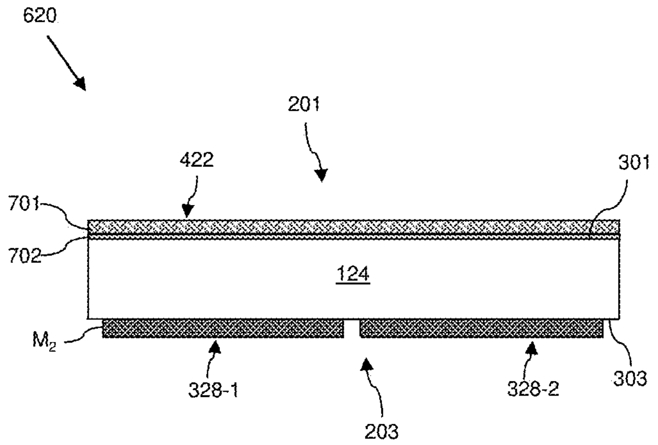
FIG. 10 is a side cross-sectional view of a radiation detector having asymmetric blocking contacts (ABCs) according to another embodiment of the present disclosure.

FIG. 10 is a side cross-sectional view of a radiation detector 620 having asymmetric blocking contacts (ABCs) according to another embodiment of the present disclosure. Referring to FIG. 10, the radiation detector 620 includes a semiconductor material substrate 124 (e.g., a plate-shaped semiconductor substrate), such as a cadmium zinc telluride (CZT) substrate. The radiation detector 620 includes a cathode electrode 422 located over a first surface 301 of the semiconductor material substrate 124 on a first side 201 of the radiation detector 620. The cathode electrode 422 may include a metallic material layer 701 and a semiconductor material layer 702 located between the metallic material layer 701 and the first surface 301 of the semiconductor material substrate 124, as described above with reference to FIG. 7. In various embodiments, the semiconductor material layer 702 may directly contact the first surface 301 of the semiconductor material substrate 124. In some embodiments, the semiconductor material layer 702 may include a semiconductor material having a conduction band offset of 0.3 eV or more with respect to the semiconductor material of the semiconductor material substrate 124. In some embodiments, the metallic material layer 701 of the cathode electrode 422 may have a work function $\Phi_1$ that is ≥4.6 eV, including >5 eV. The cathode electrode 422 may be blocking with respect to electrons and non-blocking with respect to holes.

The radiation detector 620 may also include a plurality of anode electrodes 328-1, 328-2 are located over a second surface 303 of the semiconductor material substrate 124 on a second side 203 of the radiation detector 620. Each of the anode electrodes 328-1, 328-2 may include a metallic material ($M_2$) directly contacting the second surface 303 of the semiconductor material substrate 124, such as described above with reference to FIG. 5. In various embodiments, the metallic material ($M_2$) of the anode electrodes 328-1, 328-2 may have a work function $\Phi_2$ that is <4.6 eV. The anode electrodes 328-1, 328-2 may be blocking with respect to holes and non-blocking with respect to electrons.

Figure 11:
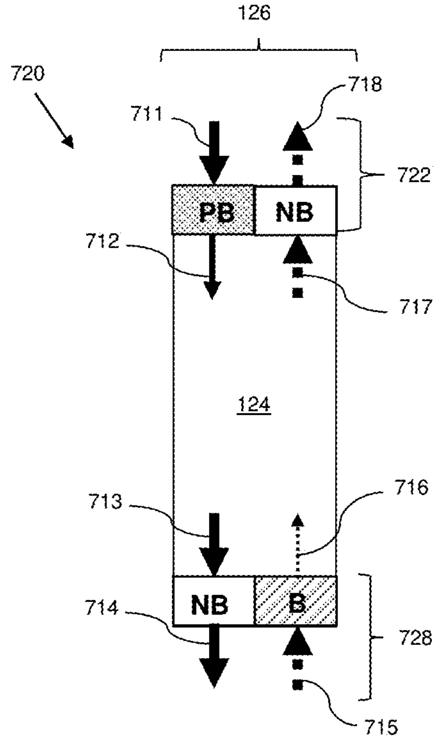
FIG. 11 is a schematic cross-section view of an individual detector pixel of a radiation detector including an asymmetric blocking contact (ABC) at the anode-side of the radiation detector and an injecting asymmetric contact (IAC) at the cathode-side of the radiation detector and schematically illustrating the flow of charge carriers in the radiation detector.

Further embodiments are directed to radiation detectors having at least one injecting asymmetric contact (IAC). In various embodiments, an injecting asymmetric contact (IAC) may be non-blocking with respect to carriers (i.e., holes or electrons) that are extracted by the contact from the radiation-sensitive semiconductor material substrate and may be injecting with respect to the opposite type of carrier that may be injected from the contact into the radiation-sensitive semiconductor material substrate. Accordingly, the IAC may enable charge carriers of a first type (i.e., holes or electrons) to be easily collected from the semiconductor material substrate (e.g., CZT) while also permitting a controlled amount of charge carriers of the opposite type (i.e., electrons or holes) to be injected from the contact into the semiconductor material substrate. FIG. 11 is a schematic cross-sectional view of an individual detector pixel 126 of a radiation detector 720 including an anode asymmetric blocking contact (ABC) at the anode-side of the radiation detector 720 and a cathode injecting asymmetric contact (IAC) at the cathode-side of the radiation detector 720. The solid arrows 711, 712, 713 and 714 on the left-hand side of FIG. 11 schematically illustrate the flow of electrons in the radiation detector 720, and the dashed arrows 715, 716, 717 and 718 on the right-hand side of FIG. 11 schematically illustrate the flow of holes in the radiation detector 720.

Referring to FIG. 11, the anode electrode 728 of radiation detector 720 may be blocking with respect to holes (schematically indicated by the hatched region "B" in FIG. 11) and may be non-blocking with respect to electrons (schematically indicated by the region labeled "NB" in FIG. 11). Accordingly, the anode electrode(s) 728 of the radiation detector 720 may provide an anode asymmetric blocking contact (ABC). In some embodiments, the anode electrode(s) 728 may include a metallic material ($M_2$) directly contacting the semiconductor substrate 124, such as described above with reference to FIGS. 5 and 10. In various embodiments, the metallic material ($M_2$) of the anode electrode(s) 728 may have a work function $\Phi_2$ that is <4.6 eV. Alternatively, the anode electrode(s) 728 may include a metallic material layer and a semiconductor material layer located between the metallic material layer and the second surface of the semiconductor material substrate, such as described above with reference to FIGS. 7 and 9. In some embodiments, the semiconductor material layer may directly contact the semiconductor material substrate 124 and may have a negative valence band offset of 0.3 eV or more with respect to the semiconductor material substrate 124.

Referring again to FIG. 11, the cathode electrode 722 of the radiation detector 720 may be non-blocking with respect to holes (schematically indicated by the region labeled "NB" in FIG. 11), and may be partially-blocking with respect to electrons (schematically indicated by the region labeled "PB" in FIG. 11). In particular, holes flowing in the semiconductor material substrate (indicated by large arrow 717) are able to pass from the semiconductor material substrate 124 to the cathode electrode 722 (indicated by large arrow 718) without significant blocking. Electrons from the cathode electrode 722 (indicated by large arrow 711) may be partially blocked from entering the semiconductor material substrate 124. However, as compared to the radiation detector 320 described above with reference to FIG. 6, a relatively larger portion of the electrons are injected from the cathode electrode 722 into the semiconductor material substrate 124 (indicated by intermediate-sized arrow 712). Accordingly, since the cathode electrode 722 is non-blocking with respect to holes and enables a significant amount of electrons to be injected from the cathode electrode 722 into the semiconductor material substrate 124, it may be referred to as a cathode injecting asymmetric contact (IAC).

A cathode injecting asymmetric contact (IAC) may be utilized on the cathode-side of the radiation detector 720 to enable a controlled injection of electrons into the semiconductor material substrate 124 of the radiation detector 720. This may enable partial neutralization of holes which are generated in response to photon interaction events. The holes generated by photon interaction events (or "photoholes") have a significantly lower mobility than the corresponding electrons generated by the photon interaction events and also have a tendency to get trapped at a localized state within the semiconductor material substrate 124. An excess of photoholes that are trapped and/or slowly moving within the semiconductor material substrate 124 may negatively affect detector performance, and may reduce the magnitude of any electric field. A controlled injection of electrons from the cathode electrode 722 into the semiconductor material substrate 124 may eliminate excessive holes (e.g., via electron-hole recombination), either before or after they are trapped, and thus may improve detector performance. Injected electrons which do not recombine with holes may pass through the semiconductor material substrate 124 where they may reach the anode electrode 728.

In the prior art radiation detector having a dielectric (e.g., oxide) barrier layer between the semiconductor material substrate 124 and the metallic contacts, such as described above with reference to FIG. 3, the dielectric barrier layer on the anode-side of the radiation detector would impede the escape of the injected electrons from the cathode electrode 722. This may result in an electron accumulation until a change in the electric field is induced near the anode electrode. This change in the electric field results in an undesirable increase in hole injection from the anode electrode, which would require a higher dark current compensation capability in the detector read-out circuitry (e.g., ASIC), and may result in increased shot noise. In case the increased hole injection cannot be compensated by the detector read-out circuitry, an error known as "baseline shift" may be induced in the integrated charge, resulting in a shift in the detected spectrum, which is undesirable for good image reconstruction. Accordingly, by using an injecting asymmetric contact (IAC) on the cathode-side of the radiation detector in combination with an asymmetric blocking contact (ABC) that is blocking for holes and non-blocking for electrons on the anode-side of the radiation detector, any injected electrons from the cathode electrode 722 that reach the anode electrode 728 may be easily extracted, thereby avoiding the negative effects of excessive accumulation of injected electrons on the anode-side of the radiation detector.

Figure 12:
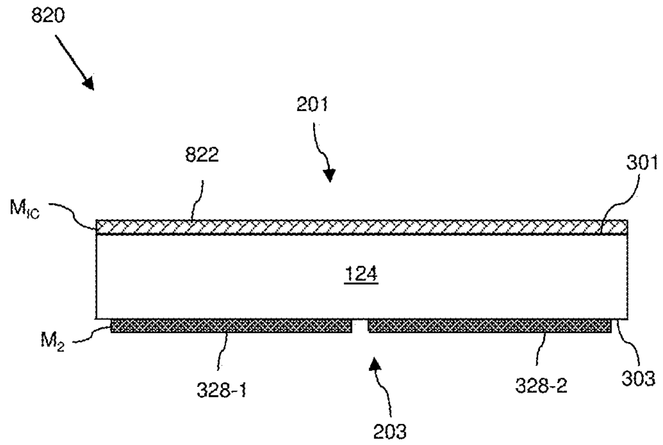
FIG. 12 is a side cross-sectional view of a radiation detector having asymmetric blocking contacts (ABCs) on the anode-side of the radiation detector and an injecting asymmetric contact (IAC) on the cathode-side of the radiation detector according to another embodiment of the present disclosure.

FIG. 12 is a side cross-sectional view of a radiation detector 820 having asymmetric blocking contacts (ABCs) on the anode-side of the radiation detector 820 and an injecting asymmetric contact (IAC) on the cathode-side of the radiation detector 820 according to another embodiment of the present disclosure. Referring to FIG. 12, the radiation detector 820 includes a semiconductor material substrate 124 (e.g., a plate-shaped semiconductor substrate), such as a cadmium zinc telluride (CZT) substrate. The radiation detector 820 includes a cathode electrode 822 located over a first surface 301 of the semiconductor material substrate 124 on a first side 201 of the radiation detector 820, and a plurality of anode electrodes 328-1, 328-2 located over a second surface 303 of the semiconductor material substrate 124 on a second side 203 of the radiation detector 820.

Each of the anode electrodes 328-1, 328-2 may include a metallic material ($M_2$) directly contacting the second surface 303 of the semiconductor material substrate 124, such as described above with reference to FIG. 5. In various embodiments, the metallic material ($M_2$) of the anode electrodes 328-1, 328-2 may have a work function 2 that is <4.6 eV. The anode electrodes 328-1, 328-2 may be blocking with respect to holes and non-blocking with respect to electrons, and thus may be considered asymmetric blocking contacts (ABCs).

In alternative embodiments, the anode electrodes 328-1, 328-2 may each include a metallic material layer 703 and a semiconductor material layer 704 (not shown in FIG. 12) located between the metallic material layer and the second surface of the semiconductor material substrate 124, such as described above with reference to FIGS. 7 and 9. In some embodiments, the semiconductor material layer may directly contact the semiconductor material substrate 124 and may have a valence band offset of 0.3 eV or more with respect to the semiconductor material substrate 124. As discussed above, this may provide an anode electrode that is blocking with respect to holes and non-blocking with respect to electrons.

The cathode electrode 822 in the radiation detector 820 of FIG. 12 may be an injecting asymmetric contact (IAC). The cathode electrode 822 may be non-blocking with respect to holes and may enable a significant amount of electrons to be injected from the cathode electrode 822 into the semiconductor material substrate 124. The cathode electrode 822 may include a metallic material (Mic). In various embodiments, the metallic material (Mic) may directly contact the first surface 301 of the semiconductor material substrate 124. In various embodiments, the metallic material (Mc) of the cathode electrode 822 of the radiation detector 820 may have an intermediate work function Pint that is within a range that is greater than or equal to 4.6 eV and less than or equal to 4.8 eV. The use of a metallic material (Mic) having an intermediate work function Pint may provide a cathode electrode 822 that is non-blocking with respect to holes and may also enable at least some electrons to pass from the cathode electrode 822 into the semiconductor material substrate 124. Thus, the cathode electrode 822 may easily collect holes from the semiconductor material substrate 124 and may provide a controlled injection of electrons from the cathode electrode 822 into the semiconductor material substrate 124. In some embodiments, the metallic material (Mic) of the cathode electrode 822 may provide a Schottky barrier of between about 0.48 and about 0.68 eV for CZT and may result in a current density of the current injected from the cathode electrode 822 that is between about $4.5\times10^{-6}$ A/cm$^2$ to about $1\times10^{-2}$ A/cm$^2$, including about $1\times10^{-4}$ A/cm$^2$.

Suitable moderate work function metallic materials (Mic) for the cathode electrode 822 may include, for example, silver (Ag), iron (Fe), niobium (Nb), molybdenum (Mo), copper (Cu) or ruthenium (Ru). Some of these materials have variable work functions depending on their deposition process as is known in the art. Thus, the work functions may be tuned using known deposition parameters to be in the desired range. Other suitable moderate work function metallic materials, including metals and alloys containing at least one metal and at least one other metal or non-metal element, are within the contemplated scope of disclosure.

Figure 13:
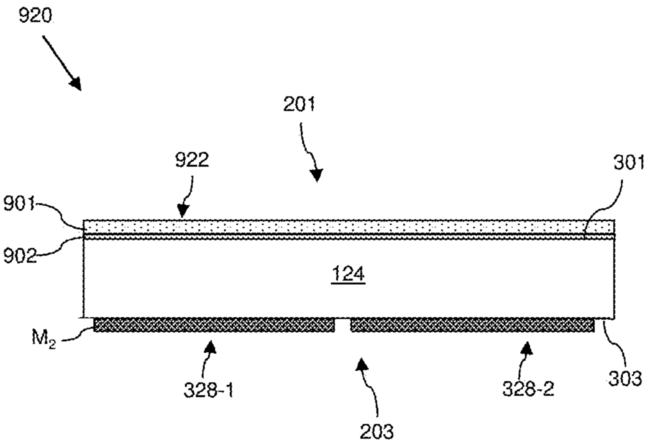
FIG. 13 is a side cross-sectional view of a radiation detector having asymmetric blocking contacts (ABCs) on the anode-side of the radiation detector and an injecting asymmetric contact (IAC) on the cathode-side of the radiation detector according to yet another embodiment of the present disclosure.

FIG. 13 is a side cross-sectional view of a radiation detector 920 having asymmetric blocking contacts (ABCs) on the anode-side of the radiation detector 920 and an injecting asymmetric contact (IAC) on the cathode-side of the radiation detector 920 according to yet another embodiment of the present disclosure. The radiation detector 920 of FIG. 13 may be similar to the radiation detector 820 of FIG. 12, and includes a semiconductor material substrate 124 (e.g., a plate-shaped semiconductor substrate), such as a cadmium zinc telluride (CZT) substrate. The radiation detector 920 includes a cathode electrode 922 located over a first surface 301 of the semiconductor material substrate 124 on a first side 201 of the radiation detector 820, and a plurality of anode electrodes 328-1, 328-2 located over a second surface 303 of the semiconductor material substrate 124 on a second side 203 of the radiation detector 820.

Each of the anode electrodes 328-1, 328-2 may include a metallic material ($M_2$) directly contacting the second surface 303 of the semiconductor material substrate 124, such as described above with reference to FIG. 5. In various embodiments, the metallic material ($M_2$) of the anode electrodes 328-1, 328-2 may have a work function $\Phi_2$ that is <4.6 eV. The anode electrodes 328-1, 328-2 may be blocking with respect to holes and non-blocking with respect to electrons, and thus may be considered asymmetric blocking contacts (ABCs).

In alternative embodiments, the anode electrodes 328-1, 328-2 may each include a metallic material layer 703 and a semiconductor material layer 704 (not shown in FIG. 12) located between the metallic material layer and the second surface of the semiconductor material substrate, such as described above with reference to FIGS. 7 and 9. In some embodiments, the semiconductor material layer may directly contact the semiconductor and may have a valence band offset of 0.3 eV or more with respect to the semiconductor material substrate 124. As discussed above, this may provide an anode electrode that is blocking with respect to holes and non-blocking with respect to electrons.

The cathode electrode 922 may include a metallic material layer 901 and a semiconductor material layer 902 located between the metallic material layer 901 and the first surface 301 of the semiconductor material substrate 124. In various embodiments, the semiconductor material layer 902 may directly contact the first surface 301 of the semiconductor material substrate 124. In some embodiments, the semiconductor material layer 902 may include a semiconductor material having a relatively high conduction band offset (e.g., ≥0.3 eV) with respect to the semiconductor material of the semiconductor material substrate 124. In some embodiments, the metallic material layer 901 of the cathode electrode 922 may have a relatively low work function Φ, such as a work function that is <4.6 eV. The cathode electrode 922 may be an injecting asymmetric contact (IAC) that is non-blocking with respect to holes and enables a controlled injection of electrons into the semiconductor material substrate 124. In various embodiments, a thickness of the semiconductor material layer 902 of the cathode electrode 922 may be adjusted to control the amount of current (i.e., electrons) that is injected from the cathode electrode 922 into the semiconductor material substrate 124.

Suitable materials for the metallic material layer 901 of the cathode electrode 922 in the radiation detector 920 of FIG. 13 may include, for example, titanium (Ti), aluminum (Al), indium (In) or chromium (Cr). Other suitable metallic materials are within the contemplated scope of disclosure. Suitable semiconductor materials for the semiconductor material layer 902 of the cathode electrode 922 in the radiation detector 920 of FIG. 13 may include, for example, zinc telluride (ZnTe), beryllium telluride (BeTe), $CuAlTe_2$, $Ag_3PS_4$, $BaAg_2S_2$, and $Ag_3PSe_4$. Other suitable semiconductor materials are within the contemplated scope of disclosure. In some embodiments, the semiconductor material layer 902 of the cathode electrode 922 may provide a Schottky barrier height to the metallic material layer 901 of the cathode electrode that is between 0.48 eV and 0.68 eV.

Figure 14:
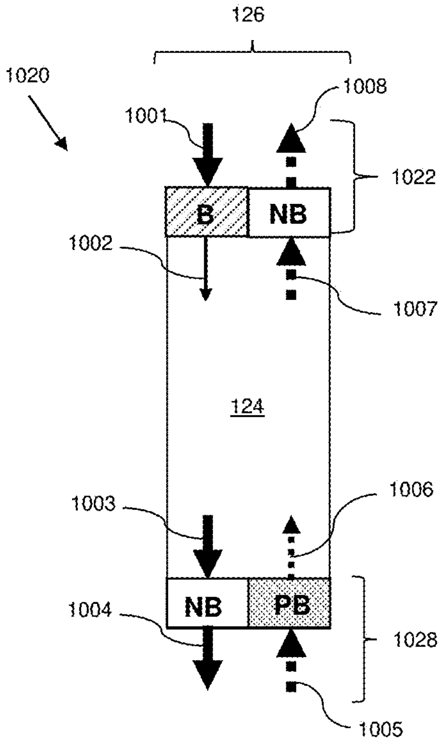
FIG. 14 is a schematic cross-section view of an individual detector pixel of a radiation detector including an asymmetric blocking contact (ABC) at the cathode-side of the radiation detector and an injecting asymmetric contact (IAC) at the anode-side of the radiation detector and schematically illustrating the flow of charge carriers in the radiation detector.

FIG. 14 is a schematic cross-section view of an individual detector pixel 126 of a radiation detector 1020 including an asymmetric blocking contact (ABC) at the cathode-side of the radiation detector 1020 and an injecting asymmetric contact (IAC) at the anode-side of the radiation detector 1020. The solid arrows 1001, 1002, 1003 and 1004 on the left-hand side of FIG. 14 schematically illustrate the flow of electrons in the radiation detector 1020, and the dashed arrows 1005, 1006, 1007 and 1008 on the right-hand side of FIG. 14 schematically illustrate the flow of holes in the radiation detector 1020.

Referring to FIG. 14, the cathode electrode 1022 of the radiation detector 1020 may be blocking with respect to electrons (schematically indicated by the hatched region "B" in FIG. 14) and may be non-blocking with respect to holes (schematically indicated by the region labeled "NB" in FIG. 14). Accordingly, the cathode electrode 1022 of the radiation detector 1020 may provide an asymmetric blocking contact (ABC). In some embodiments, the cathode electrode 1022 may include a metallic material ($M_1$) directly contacting the semiconductor substrate 124, such as described above with reference to FIGS. 5 and 9. In various embodiments, the metallic material ($M_1$) of the cathode electrode 1022 may have a work function $\Phi_1$ that is ≥4.6 eV, including ≥5.0 eV. Alternatively, the cathode electrode 1022 may include a metallic material layer and a semiconductor material layer located between the metallic material layer and the first surface of the semiconductor material substrate, such as described above with reference to FIGS. 7 and 10. In some embodiments, the semiconductor material layer may directly contact the semiconductor material substrate 124 and may have a conduction band offset of 0.3 eV or more with respect to the semiconductor material substrate 124.

In still further embodiments, the cathode electrode 1022 may be an injecting asymmetric contact (IAC) that is non-blocking with respect to holes and enables a controlled injection of electrons from the cathode electrode 1022 into the semiconductor material substrate 124 as described above with reference to FIGS. 11-13.

Referring again to FIG. 14, the anode electrode(s) 1028 of the radiation detector 1020 may be non-blocking with respect to electrons (schematically indicated by the region labeled "NB" in FIG. 14), and may be partially-blocking with respect to holes (schematically indicated by the region labeled "PB" in FIG. 14). In particular, electrons flowing in the semiconductor material substrate (indicated by large arrow 1003) are able to pass from the semiconductor material substrate 124 to the anode electrode 1028 (indicated by large arrow 1004) without significant blocking. Holes from the anode electrode 1028 (indicated by large arrow 1005) may be partially blocked from entering the semiconductor material substrate 124. However, as compared to the radiation detector 320 described above with reference to FIG. 6, a relatively larger portion of the holes are injected from the anode electrode 1028 into the semiconductor material substrate 124 (indicated by intermediate-sized arrow 1006). Accordingly, since the anode electrode 1028 is non-blocking with respect to electrons and enables a significant amount of holes to be injected from the anode electrode 1028 into the semiconductor material substrate 124, it may be referred to as an anode injecting asymmetric contact (IAC).

An anode injecting asymmetric contact (IAC) may be utilized on the anode-side of the radiation detector 1020 to enable a controlled injection of holes into the semiconductor material substrate 124 of the radiation detector 1020. In some embodiments, a dark current formed by hole injection from the anode electrode(s) 1028 may be used to fill acceptor defects/impurities (also referred to as "hole traps") in the semiconductor material substrate 124 prior to exposure of the radiation detector 120 to ionizing radiation (e.g., X-ray radiation). Subsequently, when the radiation detector 120 is exposed to ionizing radiation, the holes generated by photon interaction events are less likely to be trapped since many of the "hole traps" are already filled. Thus, the electric field within the radiation detector 1020 changes very little between when the detector is exposed and not exposed to ionizing radiation, resulting in improved detector stability.

Figure 15A:
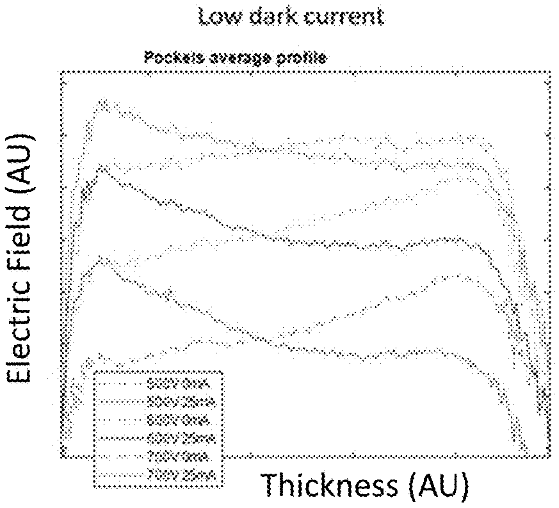
FIG. 15A is a plot showing internal electric field distribution of a first cadmium zinc telluride (CZT) radiation detector.
Figure 15B:
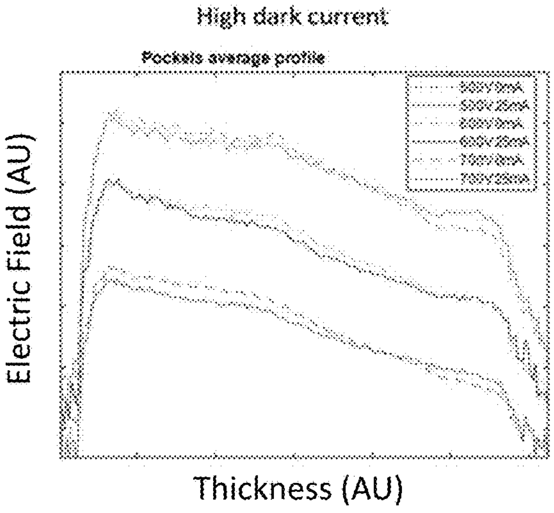
FIG. 15B is a plot showing internal electric field distribution of a second cadmium zinc telluride (CZT) radiation detector.

FIGS. 15A and 15B are plots of internal electric field distribution versus detector thickness for a pair of CZT radiation detectors measured using Pockels electro-optic effect, which describes the phase changes in polarized light passing through a uniaxial crystal which is under the stress of electric field. The plots show the electric field as a function of position within the detector, with the cathode on the left-hand side and the anode on the right-hand side. The radiation detector in FIG. 15A is similar to the radiation detector 120 described above with reference to FIG. 3. The detector in FIG. 15B includes an anode electrode which is determined to be partially-blocking with respect to holes (i.e., allows a significant amount of holes to be injected from the anode electrode into the CZT substrate), and the detector is determined to have significantly higher dark current than the detector in FIG. 15A. The electric fields are measured under different bias voltage conditions (i.e., at 500V, 600V and 700V) during both X-ray exposure (solid lines, indicating X-ray tube current of 25 mA) and when the detector is not exposed to X-rays (dashed lines, indicating X-ray tube is off when the current is 0 mA). It is apparent from FIG. 15A that for a low dark current detector, the electric field changes significantly depending on whether or not the detector is exposed to X-ray radiation. The reduction in electric field near the anode when the detector is not exposed to X-ray radiation causes instability in the detector because the risetime of the signal that the detector read-out circuitry (e.g., ASIC) sees is increased, which may change the response of the read-out circuitry. In contrast, in the high dark current detector shown in FIG. 15B, there is essentially no difference between the electric field near the anode when the detector is exposed to X-ray radiation and when it is not. This results in improved detector stability. Further, the electric field profiles in the high dark current detector (FIG. 15B) when the detector is not exposed to X-rays are very similar to the electric field profiles in the low dark current detector (FIG. 15A) when the detector is exposed to X-rays.

Without wishing to be bound by any theory, the inventors have deduced that the significantly higher dark current in the detector shown in FIG. 15B is due, at least in part, to injection of holes from the anode electrode. The inventors have additionally theorized that the holes injected from the anode electrode end up occupying a significant portion of the hole traps in the CZT substrate. This is why the electric field profiles in the high dark current detector (FIG. 15B) during both exposure and non-exposure to X-ray radiation are very similar to the electric field profiles in the low dark current detector (FIG. 15A) when it is exposed to X-ray radiation. Because the injected holes in the high dark current detector fill the majority of the hole traps prior to X-ray exposure, when the X-ray source is turned on and is creating photogenerated holes, the photogenerated holes are far less likely to become trapped because the majority of the hole traps are already occupied.

Accordingly, utilizing an anode electrode 1028 that is non-blocking for electrons and provides only some blocking for holes as is illustrated in FIG. 14 may enable a controlled injection of holes from the anode electrode 1028 into the semiconductor material substrate 124. The injected holes may occupy hole traps within the semiconductor material substrate 124 so that when the radiation detector 1020 is subsequently exposed to ionizing radiation (e.g., X-rays), the resulting photogenerated holes may be less likely to become trapped before reaching the cathode electrode 1022. This may improve detector stability and performance.

Figure 16:
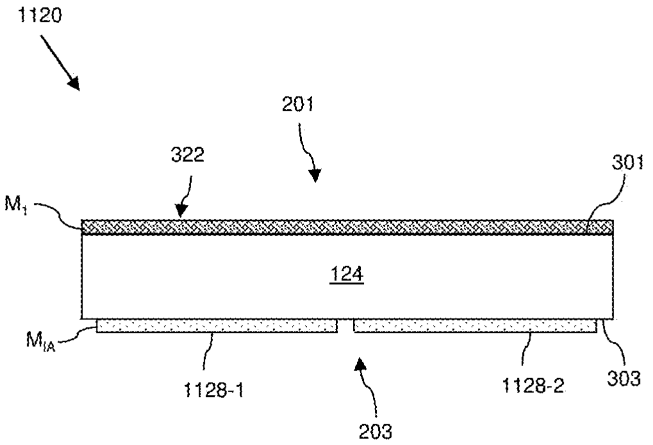
FIG. 16 is a side cross-sectional view of a radiation detector having an asymmetric blocking contact (ABC) on the cathode-side of the radiation detector and injecting asymmetric contacts (IACs) on the anode-side of the radiation detector according to another embodiment of the present disclosure.

FIG. 16 is a side cross-sectional view of a radiation detector 1120 having an asymmetric blocking contact (ABC) on the cathode-side of the radiation detector 1120 and injecting asymmetric contacts (IACs) on the anode-side of the radiation detector 1120 according to another embodiment of the present disclosure. Referring to FIG. 16, the radiation detector 1120 includes a semiconductor material substrate 124 (e.g., a plate-shaped semiconductor substrate), such as a cadmium zinc telluride (CZT) substrate. The radiation detector 1120 includes a cathode electrode 322 located over a first surface 301 of the semiconductor material substrate 124 on a first side 201 of the radiation detector 820, and a plurality of anode electrodes 1128-1, 1128-2 located over a second surface 303 of the semiconductor material substrate 124 on a second side 203 of the radiation detector 1120.

The cathode electrode 322 of the radiation detector 1120 may include a metallic material ($M_1$) directly contacting the semiconductor substrate 124, such as described above with reference to FIGS. 5 and 9. In various embodiments, the metallic material ($M_1$) of the cathode electrode 322 may have a work function $\Phi_1$ that is ≥4.6 eV, including ≥5.0 eV. Alternatively, the cathode electrode 322 may include a metallic material layer 701 and a semiconductor material layer 703 located between the metallic material layer and the first surface 301 of the semiconductor material substrate 124, such as described above with reference to FIGS. 7 and 10. In some embodiments, the semiconductor material layer may directly contact the semiconductor material substrate 124 and may have a conduction band offset of 0.3 eV or more with respect to the semiconductor material substrate 124. Thus, in some embodiments, the cathode electrode 322 may be an asymmetric blocking contact (ABC) that is blocking for holes and non-blocking for electrons. Alternatively, the cathode electrode 322 may be an injecting asymmetric contact (IAC) that is non-blocking with respect to holes and enables a controlled injection of electrons from the cathode electrode 1022 into the semiconductor material substrate 124 as described above with reference to FIGS. 11-13.

Each of the anode electrodes 1128-1, 1128-2 of the radiation detector 1120 may include a metallic material MIA. The metallic material MIA of the anode electrodes 1128-1, 1128-2 may directly contact the second surface 303 of the semiconductor material substrate 124. In some embodiments, the metallic material MIA of the anode electrodes may have a relatively high work function Φ, such as a work function that is ≥4.6 eV, including ≥5.0 eV. Suitable high work function metallic materials (MIA) for the anode electrodes 1128-1, 1128-2 may include, for example, gold (Au), nickel (Ni) or platinum (Pt). Other suitable high work function metallic materials, including metals and alloys containing at least one metal and at least one other metal or non-metal element, are within the contemplated scope of disclosure. In various embodiments, the anode electrodes 1128-1, 1128-2 may be injecting asymmetric contacts (IACs) that are non-blocking with respect to electron extraction and may also enable a significant portion of holes to pass from the anode electrodes 1128-1, 1128-2 into the semiconductor material substrate 124.

Figure 17:
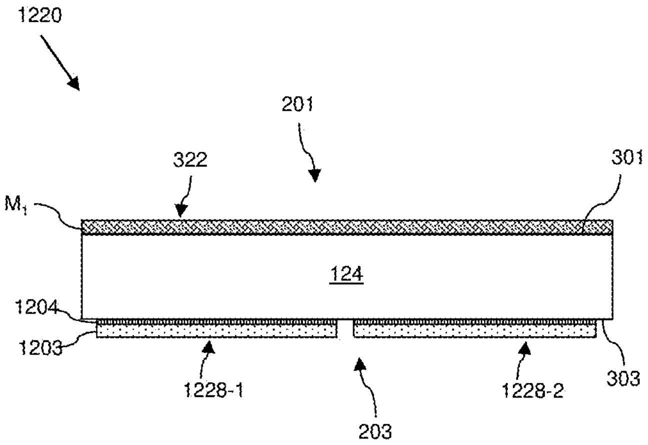
FIG. 17 is a side cross-sectional view of a radiation detector having an asymmetric blocking contact (ABC) on the cathode-side of the radiation detector and injecting asymmetric contacts (IACs) on the anode-side of the radiation detector according to yet another embodiment of the present disclosure.

FIG. 17 is a side cross-sectional view of a radiation detector 1220 having an asymmetric blocking contact (ABC) on the cathode-side of the radiation detector 1220 and injecting asymmetric contacts (IACs) on the anode-side of the radiation detector 1220 according to another embodiment of the present disclosure. Referring to FIG. 17, the radiation detector 1220 includes a semiconductor material substrate 124 (e.g., a plate-shaped semiconductor substrate), such as a cadmium zinc telluride (CZT) substrate. The radiation detector 1220 includes a cathode electrode 322 located over a first surface 301 of the semiconductor material substrate 124 on a first side 201 of the radiation detector 1220, and a plurality of anode electrodes 1228-1, 1228-2 located over a second surface 303 of the semiconductor material substrate 124 on a second side 203 of the radiation detector 1220.

The cathode electrode 322 of the radiation detector 1220 may include a metallic material ($M_1$) directly contacting the semiconductor substrate 124, such as described above with reference to FIGS. 5 and 9. In various embodiments, the metallic material ($M_1$) of the cathode electrode 322 may have a work function $\Phi_1$ that is ≥4.6 eV, including ≥5.0 eV. Alternatively, the cathode electrode 322 may include a metallic material layer 701 and a semiconductor material layer 702 located between the metallic material layer and the first surface of the semiconductor material substrate, such as described above with reference to FIGS. 7 and 10. In some embodiments, the semiconductor material layer may directly contact the semiconductor material substrate 124 and may have a conduction band offset of 0.3 eV or more with respect to the semiconductor material substrate 124. Thus, in some embodiments, the cathode electrode 322 may be an asymmetric blocking contact (ABC) that is blocking for holes and non-blocking for electrons. Alternatively, the cathode electrode 322 may be an injecting asymmetric contact (IAC) that is non-blocking with respect to holes and enables a controlled injection of electrons from the cathode electrode 1022 into the semiconductor material substrate 124 as described above with reference to FIGS. 11-13.

Each of the anode electrodes 1228-1, 1228-2 may include a metallic material layer 1203 and a semiconductor material layer 1204 located between the metallic material layer 1203 and the second surface 303 of the semiconductor material substrate 124. In various embodiments, the semiconductor material layer 1204 may directly contact the second surface 303 of the semiconductor material substrate 124.

In various embodiments, the semiconductor material layer 1204 of the anode electrodes 1228-1, 1228-2 may include a semiconductor material having low conduction and valence band offsets relative to the material of the semiconductor material substrate 124. For example, the semiconductor material of the semiconductor material layer 1204 may have a conduction band offset relative to the semiconductor material of the semiconductor material substrate 124 that is ≤0.1 eV, such as ≤0.05 eV, and the semiconductor material of the semiconductor material layer 1204 may have a valence band offset relative to the semiconductor material of the semiconductor material substrate 124 that is ≤0.1 eV, such as ≤0.05 eV. Suitable semiconductor materials for the semiconductor material layer 1204 may include, for example, tellurium (Te), graphene, indium antimonide (InSb), gallium antimonide (GaSb), indium arsenide (InAs), germanium (Ge), silicon (Si), or silicon germanium (SiGe). Other suitable semiconductor materials are within the contemplated scope of disclosure. The semiconductor materials used for semiconductor material layer 1204 of the anode electrodes 1228-1, 1228-2 may be doped or undoped, have an amorphous or crystalline structure, and/or may have a stochiometric or non-stochiometric composition.

In various embodiments, the metallic material layer 1203 of the anode electrodes 1228-1, 1228-2 may include a metallic material having a relatively high work function Φ, such as a work function that is ≥4.6 eV, including ≥5.0 eV. Suitable high work function metallic materials for the anode electrodes 1228-1, 1228-2 may include, for example, gold (Au), nickel (Ni) or platinum (Pt). Other suitable high work function metallic materials, including metals and alloys containing at least one metal and at least one other metal or non-metal element, are within the contemplated scope of disclosure. In various embodiments, the anode electrodes 1228-1, 1228-2 may be injecting asymmetric contacts (IACs) that are non-blocking with respect to electrons and may also enable a significant portion of holes to pass from the anode electrodes 1228-1, 1228-2 into the semiconductor material substrate 124.

Figure 18:
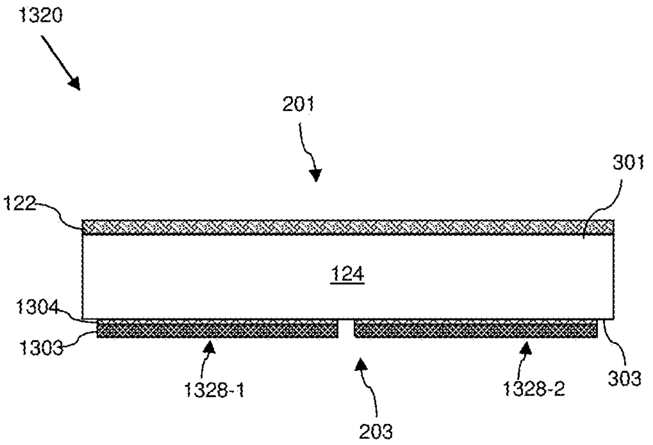
FIG. 18 is a side cross-sectional view of a radiation detector according to another embodiment of the present disclosure.

FIG. 18 is a side cross-sectional view of a radiation detector 1320 according to another embodiment of the present disclosure. Referring to FIG. 18, the radiation detector 1320 includes a semiconductor material substrate 124 (e.g., a plate-shaped semiconductor substrate), such as a cadmium zinc telluride (CZT) substrate. A cathode electrode 122 is located over a first surface 301 of the semiconductor material substrate 124 on a first side 201 of the radiation detector 420. A plurality of anode electrodes 1328-1, 1328-2 are located over a second surface 303 of the semiconductor material substrate 124 on a second side 203 of the radiation detector 1320.

In the embodiment shown in FIG. 18, the anode electrodes 1328-1, 1328-2 each include a metallic material layer 1303 and a semiconductor material layer 1304 located between the metallic material layer 1303 and the second surface 303 of the semiconductor material substrate 124. In some embodiments, the semiconductor material layer 1304 of each of the anode electrodes 1328-1, 1328-2 may directly contact the second surface 303 of the semiconductor material substrate 124.

The semiconductor material layer 1304 of the anode electrodes 1328-1, 1328-2 may include cadmium and sulfur. For example, the semiconductor material layer 1304 may include cadmium sulfide (CdS). In some embodiments, the semiconductor material layer 1304 may include cadmium and sulfur with up to 50 at % tellurium, such as 0.1 to 10 at % tellurium, and up to 50 at % zinc, such as 0.1 to 10 at % zinc or 0.1 to 20% zinc. In other words, the semiconductor material layer 1304 may comprise cadmium sulfide containing at least one of tellurium or zinc.

A cadmium sulfide layer may be formed using a suitable deposition technique, such by physical vapor deposition (e.g., sputtering, evaporation), chemical-physical deposition (e.g., electron cyclotron resonance plasma (ECR). atomic layer deposition (ALD)), and/or epitaxial growth (e.g., metalorganic chemical vapor deposition (MOCVD), molecular beam epitaxy (MBE)). These deposition processes generally require complex equipment and have process constraints that may make them difficult or impossible to apply to form high-quality CdS films. Furthermore, the resulting layer structure may not only be the intended CdS layer but may have an oxide layer left over from the surface oxide layer normally found on the CZT. This oxide layer may interfere with the desired operation of the CdS layer. It may be possible to remove such an oxide layer using an extra step in the deposition process, but this adds further complexity, and may alter the stoichiometry of the resulting CZT surface in an unintended way.

Various embodiments include methods of forming a semiconductor material layer including cadmium and sulfur, such as CdS, CdZnS, CdTeS or CdZnTeS, on the surface of crystalline CdZnTe using a relatively straightforward gas-phase process. For simplicity, the CdS, CdZnS, CdTeS or CdZnTeS material is abbreviated as "CdZnTeS semiconductor material" below. The semiconductor material layer may be used to provide an asymmetric blocking contact (ABC) anode electrode structure that may enable easy extraction of photoelectrons while blocking the injection of holes. Furthermore, the process may be used to provide a layer structure with low oxide content, even when an oxide layer is initially present on the CdZnTe surface.

In various embodiments, the process of forming a CdZnTeS semiconductor material layer 1304 may include exposing the CZT surface to a dilute mixture of $H_2S$ and a carrier gas. In cases where the process gas does not contain any group II elements, any such elements present in the resulting semiconductor material layer 1304 may come from either the CZT substrate, or from an oxide material that may be present on the surface of the CZT substrate. The resulting semiconductor material layer 1304 may have a stochiometric composition, i.e., $Cd_{1-x}Zn_xTe_yS_{1-y}$, or may be a mixture that is similar. In this composition, $0 \leq x \leq 0.5$ and $0 \leq y \leq 0.5$, for example, $0.01 \leq x \leq 0.1$ and/or $0.01 \leq y \leq 0.1$. The resulting semiconductor material layer 1304 may include a crystalline material. A suitable metallic material layer 1303 as described above may be formed over the semiconductor material layer 1304 to provide the anode electrode 1328 structure.

In various embodiments, a CdZnTeS semiconductor material layer 1304 may be formed using simple equipment by passing the process gas over the heated surface of a CZT substrate. The process case may be pure $H_2S$, although this may pose certain safety and equipment challenges. Dilution of the $H_2S$, i.e., use of a dilute $H_2S$ mixture, may provide a new and safer process gas, while remaining effective at achieving the desired layer composition at acceptable reaction rates.

This process may be effective on a CZT surface that has no significant oxide, and may result in a CdZnTeS layer on top of the CZT. This process may also be effective when a surface oxide is present, in which case the oxide may be converted to CdZnTeS, and the resulting layer may have relatively low or potentially negligible remaining oxide content. Because of this, oxygen (O) is not included in the chemical formula of the formed layer, even though there may be some detectable amount of oxygen remaining. The CdZnTeS composition formed by conversion of oxide may not be identical to that formed by conversion of CZT.

Based on experimental observations, the reaction on an oxidized surface does not appear to stop once the oxide is converted, but rather is followed by conversion of the CZT. Our observations suggest that in this case, the CZT conversion proceeds at a faster rate than it does on an unoxidized CZT surface. In other words, the presence of an oxide may assist in the conversion of CZT to CdZnTeS semiconductor material.

Figure 19A:
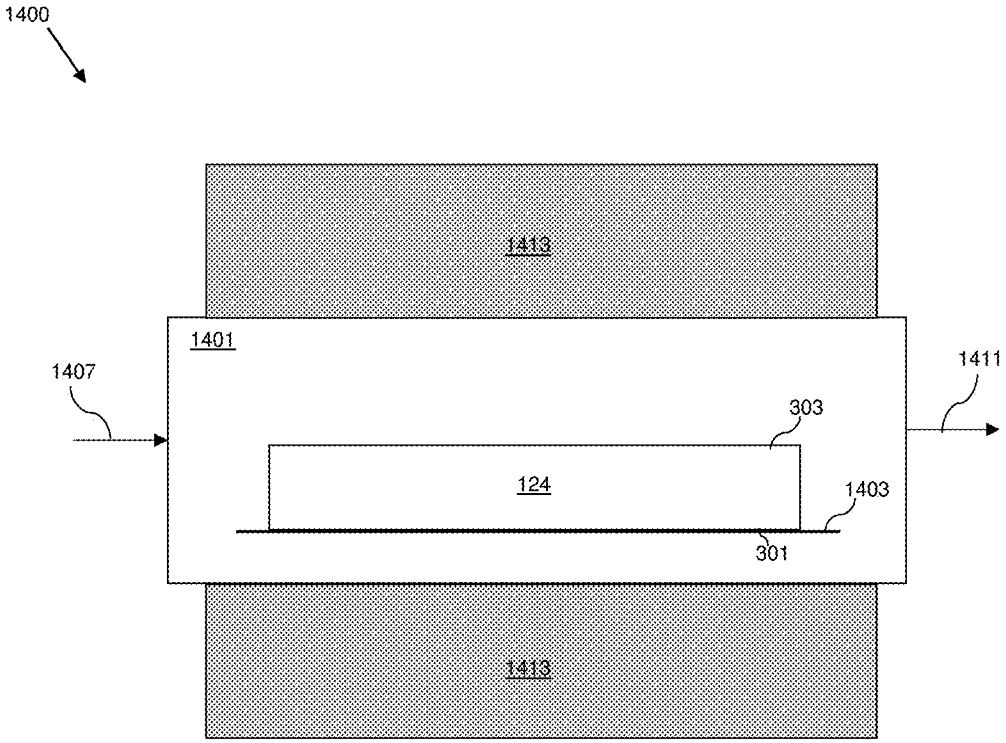
FIGS. 19A-19E are sequential side cross-sectional views of an exemplary structure during a process of fabricating a pixelated radiation detector including anode electrodes having a CdZnTeS semiconductor material layer according to various embodiments of the present disclosure.

FIGS. 19A-19E are sequential side cross-section views of an exemplary structure during a process of fabricating a pixelated radiation detector 1320 including anode electrodes 1328-1, 1328-2 having a CdZnTeS semiconductor material layer 1304 according to various embodiments of the present disclosure. Referring to FIG. 19A, a semiconductor material substrate 124 (e.g., a plate-shaped semiconductor substrate), such as a cadmium zinc telluride (CZT) substrate, may be provided within a processing chamber 1401 of a deposition apparatus 1400. In one embodiment, the deposition apparatus 1400 may be a quartz tube furnace. Other suitable deposition apparatuses are within the contemplated scope of disclosure. The semiconductor material substrate 124 may be placed on a suitable support 1403 within the processing chamber 1401, such as an aluminum carrier block. A first surface 301 of the semiconductor material substrate 124 may face towards the support 1403, and a second surface 303 of the semiconductor material substrate 124 may face away from the support 1403. In various embodiments, the second surface 303 of the semiconductor material substrate 124 may be an (111)A oriented single-crystal semiconductor surface. The second surface 303 may optionally be polished prior to the deposition process. An optional etching process may be utilized to remove polishing damage from the second surface 303. In some embodiments, an oxide layer may optionally be formed on the second surface 303 of the substrate 124 after the polishing and optional etching process(es) and prior to the deposition process described below.

The deposition apparatus 1400 may also include a heater apparatus 1403 that may be configured to heat the semiconductor material substrate 124 located within the processing chamber 1401. A process gas (schematically illustrated by arrow 1407 in FIG. 19A) may be flowed through the processing chamber 1401 and over the heated second surface 303 of the semiconductor material substrate 124. The process gas may include a mixture of hydrogen sulfide ($H_2S$) and a carrier gas. The process gas mixture may exit the processing chamber as an exhaust flow (schematically illustrated by arrow 1411).

The concentration of $H_2S$ gas in the process gas may be between about 10 and about 5000 ppm (e.g., 100-1000 ppm, such as about 500 ppm), although lesser and greater concentrations of $H_2S$ may also be utilized. The carrier gas may include one or more non-reactive gases, such as nitrogen, a noble gas (e.g., argon), or the like. During the deposition process, the substrate 124 may be maintained at a temperature between about 100° C. and about 500° C. (e.g., between about 200° C. and about 300° C.), although higher or lower temperatures may also be utilized. The pressure within the processing chamber may be at or near atmospheric pressure (e.g., 0.8 to 1.2 bar). The flow rate of the process gas mixture may be between about 50 and 150 sccm (e.g., ~100 sccm).

Figure 19B:
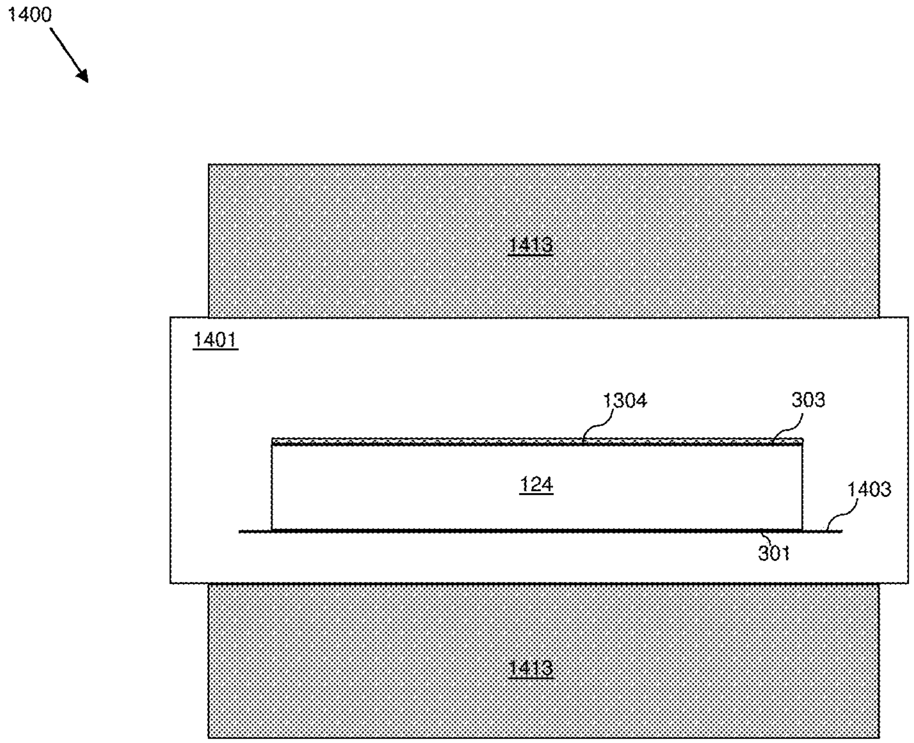

The semiconductor material substrate 124 may be maintained within the processing chamber 1401 with the process gas flowing over the substrate 124 until a desired thickness of the CdZnTeS semiconductor material layer 1304 is formed over the second surface 303 of the substrate 124. In some embodiments, the duration of the deposition process may be between about 30 minutes and 2 hours, although greater and lesser durations are within the contemplated scope of the disclosure. FIG. 19B illustrates the semiconductor material substrate 124 following deposition of the CdZnTeS semiconductor material layer 1304 over the second surface 303 of the substrate 124. In some embodiments, the thickness of the deposited CdZnTeS semiconductor material layer 1304 may be between about 2 nm and about 150 nm, such as between about 4 nm and about 100 nm (e.g., 8-60 nm), although greater and lesser thicknesses may also be utilized. The deposited layer 1304 may be $Cd_{1-x}Zn_xTe_yS_{1-y}$, where $0\leq x\leq 0.5$ and $0\leq y\leq 0.5$, including where $0<x\leq 0.5$ and $0<y\leq 0.5$. In some embodiments, $0.01\leq x0\leq 0.2$, such as $0.01\leq x\leq 0.1$. In some embodiments, $0.01\leq y\leq 0.5$, such as $0.01\leq y\leq 0.1$. The deposited layer 1304 may also contain oxygen in addition to trace amounts of unavoidable impurities.

Figure 19C:
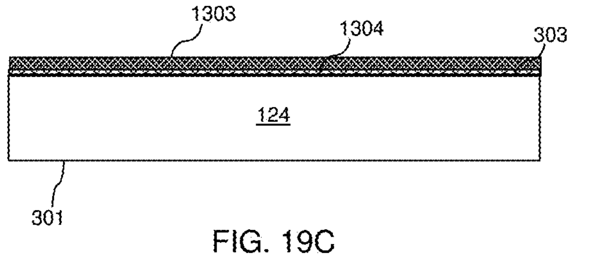

Referring to FIG. 19C, a metallic material layer 1303 as described above may be formed over the CdZnTeS semiconductor material layer 1304 using a suitable deposition method. The metallic material layer 1303 may be formed as a continuous layer over the CdZnTeS semiconductor material layer 1304.

Figure 19D:
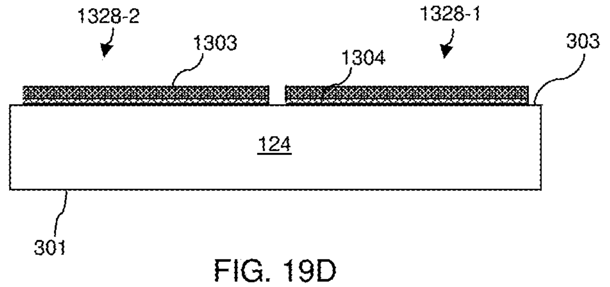

Referring to FIG. 19D, the metallic material layer 1303 and the CdZnTeS semiconductor material layer 1304 may be patterned to form discrete anode electrodes 1328-1 and 1328-2 over the second surface 303 of the semiconductor material substrate 124. In some embodiments, a photoresist layer (not shown in FIG. 19D) may be formed over the metallic material layer 1303 and lithographically patterned to form a mask in a desired pattern. An etching process may be used to remove portions of the metallic material layer 1303 and the CdZnTeS semiconductor material layer 1304 that are exposed through the mask to form the plurality of discrete anode electrodes 1328-1 and 1328-2. Other suitable techniques, such as a lift-off technique, may be used to form the discrete anode electrodes 1328-1 and 1328-2.

Figure 19E:
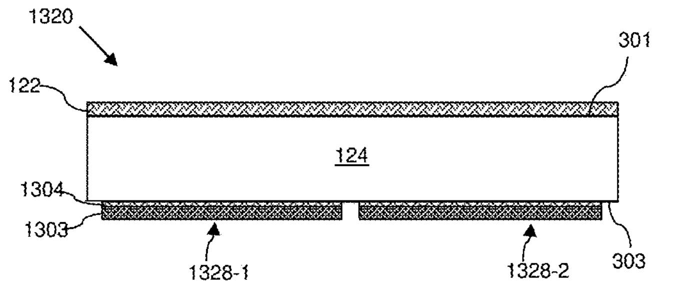

Referring to FIG. 19E, a cathode electrode 122 as described above may be formed over the first surface 301 of the semiconductor material substrate 124 to form the radiation detector 1320.

Depending on the arrangement of the semiconductor material substrate 124 within the processing chamber 1401 of the deposition apparatus 1400, in some cases during the deposition of the CdZnTeS semiconductor material layer 1304 on the second surface 303 of the semiconductor material substrate 124, an equivalent CdZnTeS layer may be formed on the first surface 301 (e.g., the (111)B surface) of the semiconductor material substrate 124. In some embodiments, the CdZnTeS layer may remain on the first surface 301 of the semiconductor material substrate 124 and may form part of the cathode electrode 122. Alternatively, the first surface 301 may be etched either with a liquid chemical etch or a plasma etch, to remove the CdZnTeS layer, returning the surface 301 to a state like what it was beforehand, potentially with an oxide layer formed over the first surface 301. In other embodiments, the first surface 301 of the semiconductor material substrate 124 may be shielded from exposure to the process gas, such as via masking, or by mechanical isolation where only one face of the substrate 124 is presented to the process gas, and the other is on a flat surface, or other techniques to prevent a significant amount of the process gas from contacting the first surface 301, and thereby inhibiting the formation of a CdZnTeS layer on the first surface 301.

Examples

Polished 10×10×2 mm (111) A oriented single-crystal CZT were exposed to 500 ppm $H_2S$ in $N_2$ at atmospheric pressure with a flow rate of 100 sccm at 200° C., 225° C., 250° C. and 280° C. for 30 min to 2 hr. Two CZT samples were exposed to $H_2S$ at the same time in each run. The samples were placed on an aluminum carrier block which was in contact with a thermocouple in a one inch diameter quartz tube in a tube furnace.

All samples were mechanically polished followed by etching in $Br_2$/methanol to remove polishing damage. $Br_2$/alcohol etches are known to produce Te rich surfaces containing Te metal ($Te^0$). Following etching three different sample treatments were applied: etching for 2 min in 10% HCl/$H_2O$ in an ultrasonic bath, vacuum annealing (VA) at 250° C. for one hour and ozone oxidation for one hour. The ozone oxidation was carried out at room temperature with a UV lamp in an enclosed box in air at one atmosphere. The HCl etch is designed to remove surface oxides, the vacuum annealing removes excess $Te^0$ left on the surface after the $Br_2$/propanol etch, and the ozone oxidation creates a surface oxide ~10 nm thick. Three different starting surfaces were explored: an oxide free surface with excess Te (HCl etched), a stoichiometric surface (vacuum annealed) and an oxidized surface (ozone treated). The total time delay between the various surface treatments and subsequent $H_2S$ exposure and surface analysis was 5-6 days, so that all samples can be expected to have some native oxide.

Photoemission survey spectra were measured at the wavelength of a lab-based Al Ka X-ray source (1486.7 eV), with a pass energy of 500 eV and step size of 0.1 eV with a resolution of 0.8 eV. High-resolution spectra of the Te 3d, S 2p, Te 4d, Cd 4d core levels and of the valence band were collected with a pass energy of 50 eV, a step size of 0.1 eV at photo energies of 270 and 350 eV. At pass energy of 50 eV, the overall resolution, including analyser and beamline contributions, was 86 meV. During data analysis, the energy scale of the photoemission spectra was calibrated using the C 1s line arising from adventitious surface carbon with a fixed value of 284.8 eV. Charging was observed in the photoemission measurements due to the highly resistive semiconductor material.

Figure 20:
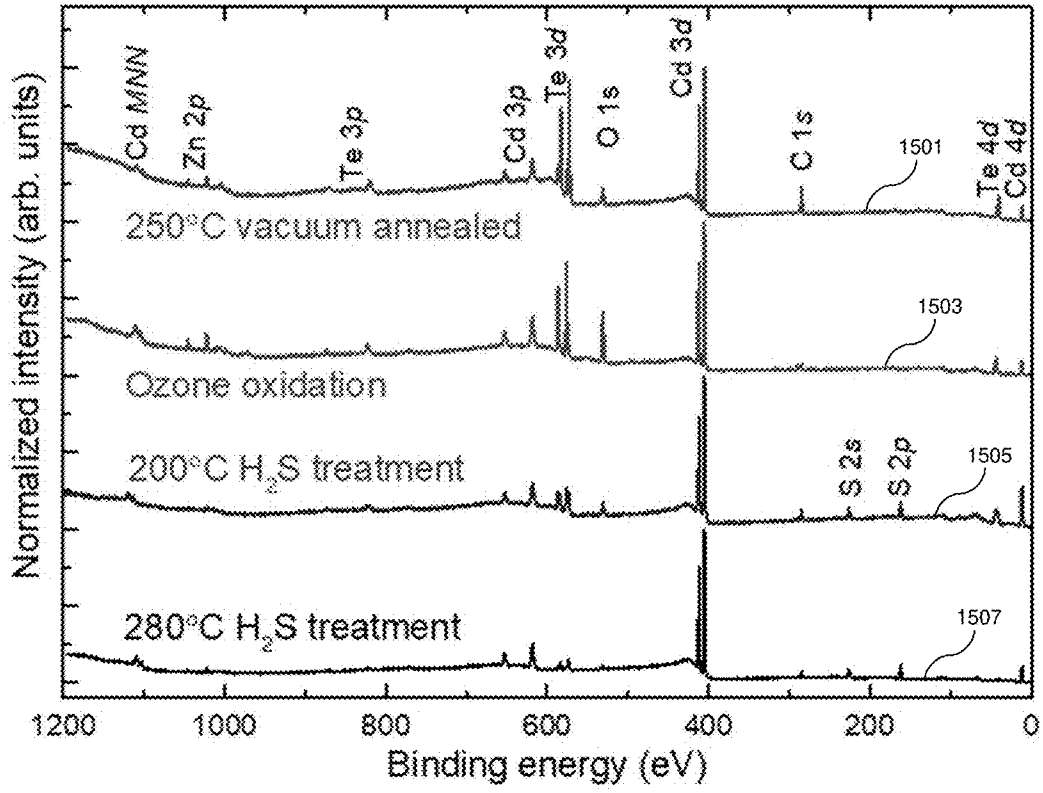
FIG. 20 is a plot of photoemission survey spectra of four samples of a CZT substrate having a CdZnTeS layer formed thereon according to various embodiments of the present disclosure.

Photoemission survey spectra of four samples are shown in FIG. 20. The data in FIG. 20 show results for samples prepared as follows: (Sample 1, curve 1501): 1 hr vacuum annealed at 250° C. to create the stochiometric surface after oxide removal etching in HCl; (Sample 2, curve 1503): exposed to UV ozone in air for one hour to create a surface oxide; (Sample 3, curve 1505): ozone oxidized and then exposed to dilute $H_2S$ at 200° C. for 30 minutes; and (Sample 4, curve 1507): ozone oxidized and exposed to dilute $H_2S$ at 280° C. for 120 minutes.

Data are presented in FIG. 20 for the ozone treated sample before (curve 1501) and after exposure to dilute $H_2S$ at 280 C (curve 1507). The $H_2S$ treated sample shows S 2s and 2p photoemission peaks that are not present before treatment. In addition, the $H_2S$ treatment at 280° C. greatly reduces the concentration of oxygen and Te.

Figure 21A:
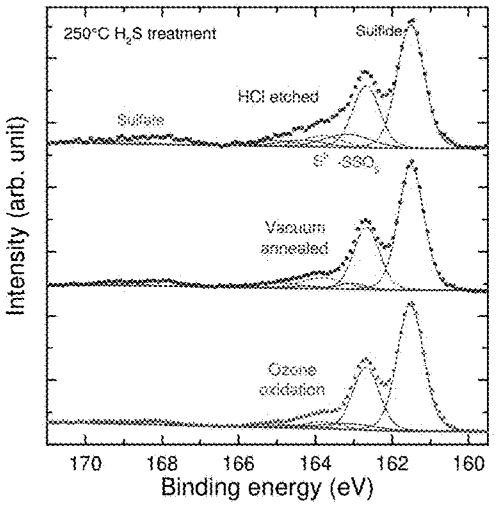
FIGS. 21A and 21B are plots showing normalized high-resolution photoemission spectra for S 2p core level of samples measured at a photon energy of 350 eV.
Figure 21B:
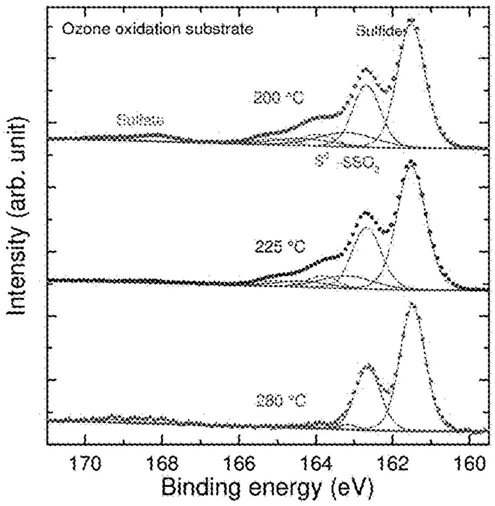

FIGS. 21A and B show normalized high-resolution photoemission spectra for S 2p core level measured at a photon energy of 350 eV. FIG. 21A shows the results for three different CZT surface preparations followed by dilute $H_2S$ exposure at 250° C. FIG. 21B shows the results for ozone oxidation surface preparation followed by dilute $H_2S$ exposure at 200° C., 225° C. and 280° C. Data associated with the S 2p peak for the sample exposed to $H_2S$ at 280° C. in FIG. 21 indicate that the sulfur is mainly in the form of a sulfide. The sulfide is most likely CdS given the relative absence of Te on the surface. Small amounts of other sulfur species are also present including sulfate ($SO_4$). Higher concentrations of the other sulfur species are observed in FIG. 21 for the samples treated with $H_2S$ at lower temperatures.

At the highest treatment temperature (280 C) the surface layer had about 90% S and 10% Te, which may provide an effective interface between the CZT substrate and the CdZnTeS layer of the anode electrode. It is anticipated that the Te fraction may be reduced further with higher temperature treatment.

Figure 22:
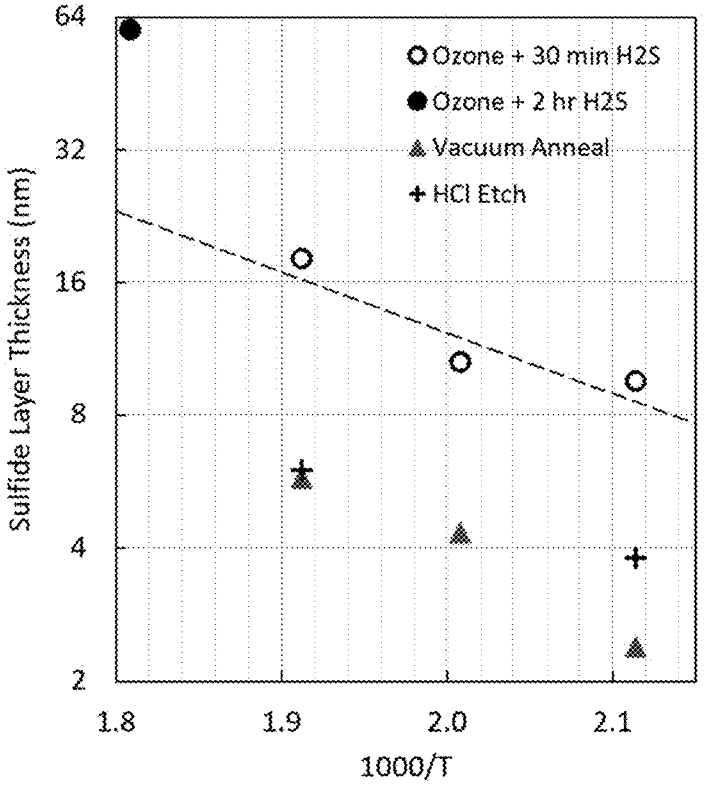
FIG. 22 is a plot showing the thickness of a sulfide layer formed over a CZT substrate as a function of growth temperature.

The thickness of the CdZnTeS layer depends on the temperature and treatment time. The thickness can be estimated from the amplitude of the S K-edge absorption peak and normalized to the thickness measured by scanning electron microscopy (SEM) in the sample treated at 280° C., and assuming the sulfide layer is CdS. Results for thickness as a function of growth temperature are shown in FIG. 22. As indicated by FIG. 22, longer exposure to $H_2S$ results in a thicker sulfide layer, and oxidized surfaces react with $H_2S$ faster than unoxidized layers.

It has previously been demonstrated that exposure to intense X-rays may cause degradation in an oxide layer on the surface of CZT. This means there may be some concern that device structures including CZT oxides as a blocking layer may degrade in their intended use as X-ray detectors due to X-ray exposure. The applicants have compared the degradation of sulfide layers formed via an embodiment method as described herein and found that the sulfide layers degrade much more slowly than the oxide layers under the same X-ray exposure. Therefore, there may be increased detector longevity in X-ray applications when using a sulfide layer as described herein.

The radiation detectors of the present embodiments may be implemented in systems used for medical imaging, such as CT imaging, as well as for non-medical imaging applications, such as industrial inspection applications.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A radiation detector, comprising:

a radiation-sensitive semiconductor material substrate;

a cathode electrode disposed over a first surface of the radiation-sensitive semiconductor material substrate; and at least one anode electrode disposed over a second surface of the radiation-sensitive semiconductor material substrate, wherein the at least one anode electrode comprises a semiconductor material layer comprising cadmium sulfide located between a metallic material and the semiconductor material substrate.

2. The radiation detector of claim 1, wherein the radiation-sensitive semiconductor substrate comprises cadmium zinc telluride (CZT).

3. The radiation detector of claim 2, wherein the semiconductor material layer comprises $Cd_{1-x}Zn_xTe_yS_{1-y}$, where $0 \leq x \leq 0.5$ and $0 \leq y \leq 0.5$.

4. The radiation detector of claim 3, wherein the semiconductor material layer comprises $Cd_{1-x}Zn_xTe_yS_{1-y}$, where $0 < x \leq 0.5$ and $0 < y \leq 0.1$.

5. The radiation detector of claim 4, wherein $0.01 \leq x \leq 0.2$.

6. The radiation detector of claim 5, wherein $0.01 \leq y \leq 0.1$.

7. The radiation detector of claim 3, wherein the semiconductor material layer further comprises oxygen.

8. The radiation detector of claim 3, wherein a thickness of the semiconductor material layer is between 2 nm and 100 nm.

9. The radiation detector of claim 8, wherein the thickness of the semiconductor material layer is between 8 nm and 60 nm.

10. The radiation detector of claim 3, wherein the semiconductor material layer directly contacts the radiation-sensitive semiconductor substrate.

11. A method of fabricating a radiation detector, comprising exposing a surface of a radiation-sensitive semiconductor material substrate to a gas containing hydrogen sulfide at an elevated temperature to form a sulfide-containing semiconductor material layer over the radiation-sensitive semiconductor material substrate; and forming a metallic material over the sulfide-containing semiconductor material layer to provide an anode electrode comprising the metallic material and the sulfide-containing semiconductor material.

12. The method of claim 11, wherein the wherein the radiation-sensitive semiconductor substrate comprises cadmium zinc telluride (CZT) and the sulfide-containing semiconductor material layer comprises $Cd_{1-x}Zn_xTe_yS_{1-y}$, where $0 \leq x \leq 0.5$ and $0 \leq y \leq 0.5$.

13. The method of claim 11, further comprising:

polishing the surface of the radiation-sensitive semiconductor material substrate prior to exposing the surface to the gas containing hydrogen sulfide.

14. The method of claim 13, further comprising:

forming an oxide layer on the surface of the radiation-sensitive semiconductor material substrate after polishing the surface and before exposing the surface to the gas containing hydrogen sulfide.

15. The method of claim 11, wherein the gas comprises a mixture of hydrogen sulfide and a carrier gas.

16. The method of claim 15, wherein a concentration of hydrogen sulfide in the gas mixture is between 10 and 5000 ppm.

17. The method of claim 15, wherein the carrier gas comprises one or more of nitrogen and a noble gas.

18. The method of claim 15, where the gas mixture is at a pressure between 0.8 and 1.2 bar.

19. The method of claim 11, wherein the surface of the radiation-sensitive semiconductor material substrate is maintained at a temperature between 100° C. and 500° C. during the formation of the sulfide-containing semiconductor material layer.

20. The method of claim 11, further comprising:

patterning the metallic material and the sulfide-containing semiconductor material layer to provide a plurality of anode electrodes over the surface of the radiation-sensitive semiconductor material substrate; and forming at least one cathode electrode over a second surface of the of the radiation-sensitive semiconductor material substrate that is opposite the surface on which the plurality of anode electrodes are formed.

* * * * *